United States Patent
Paek et al.

(10) Patent No.: US 10,921,709 B2
(45) Date of Patent: Feb. 16, 2021

(54) PHOTOSENSITIVE RESIN COMPOSITION, PHOTOSENSITIVE RESIN LAYER USING THE SAME, AND COLOR FILTER

(71) Applicant: Samsung SDI Co., Ltd., Yongin-si (KR)

(72) Inventors: Hojeong Paek, Suwon-si (KR); Jonggi Kim, Suwon-si (KR); Minjee Park, Suwon-si (KR); Woo Jung Shin, Suwon-si (KR); Jinsuop Youn, Suwon-si (KR); Bumjin Lee, Suwon-si (KR); Jihyeon Yim, Suwon-si (KR); Young Woong Jang, Suwon-si (KR)

(73) Assignee: Samsung SDI Co., Ltd., Yongin-si (KR)

( * ) Notice: Subject to any disclaimer, the term of this patent is extended or adjusted under 35 U.S.C. 154(b) by 64 days.

(21) Appl. No.: 16/190,739

(22) Filed: Nov. 14, 2018

(65) Prior Publication Data

US 2019/0243242 A1  Aug. 8, 2019

(30) Foreign Application Priority Data

Feb. 6, 2018 (KR) .................. 10-2018-0014639
Jul. 2, 2018 (KR) .................. 10-2018-0076672

(51) Int. Cl.
| G03F 7/038 | (2006.01) |
| G03F 7/032 | (2006.01) |
| G03F 7/027 | (2006.01) |
| G02B 5/20 | (2006.01) |
| G03F 7/031 | (2006.01) |
| G03F 7/00 | (2006.01) |
| G03F 7/004 | (2006.01) |

(52) U.S. Cl.
CPC ............ *G03F 7/032* (2013.01); *G02B 5/20* (2013.01); *G03F 7/0007* (2013.01); *G03F 7/0042* (2013.01); *G03F 7/0047* (2013.01); *G03F 7/0275* (2013.01); *G03F 7/031* (2013.01); *G03F 7/0388* (2013.01)

(58) Field of Classification Search
CPC ........ G03F 7/0007; G03F 7/031; G03F 7/032; G03F 7/033; G03F 7/0388; G02B 5/20; G02B 5/201
USPC .................................................. 430/7, 287.1
See application file for complete search history.

(56) References Cited

U.S. PATENT DOCUMENTS

| 6,458,908 B1 | 10/2002 | Imai et al. |
| 2017/0052444 A1 | 2/2017 | Park et al. |
| 2017/0059988 A1* | 3/2017 | Paek ............... G03F 7/0007 |
| 2017/0183565 A1 | 6/2017 | Jun et al. |
| 2019/0243242 A1 | 8/2019 | Paek et al. |
| 2019/0278173 A1* | 9/2019 | Kim ................ G03F 7/0043 |
| 2019/0278177 A1* | 9/2019 | Jeong .............. G02B 5/22 |
| 2020/0079649 A1* | 3/2020 | Miyanaga ........ G02F 1/00 |

FOREIGN PATENT DOCUMENTS

| JP | 2008-249987 A | 10/2008 |
| JP | 2012-531619 A | 12/2012 |
| JP | 2013-238837 A | 11/2013 |
| KR | 1992-7002502 A | 9/1992 |
| KR | 1994-0005617 B1 | 6/1994 |
| KR | 1995 7000359 A | 1/1995 |
| KR | 1995-0011163 B1 | 9/1995 |
| KR | 10-2014-0130216 A | 11/2014 |
| KR | 10-2016-0058632 A | 5/2016 |
| KR | 10-2016-0114362 A | 10/2016 |
| KR | 10-1712683 B1 | 3/2017 |
| KR | 10-2017-0040551 A | 4/2017 |
| KR | 10-2017-0071757 A | 6/2017 |
| KR | 10-1751646 B1 | 7/2017 |
| KR | 10-2017-0106048 A | 9/2017 |
| KR | 10-2017-0106056 A | 9/2017 |
| KR | 10-2017-0106791 A | 9/2017 |
| KR | 10-2018-0029744 A | 3/2018 |
| KR | 10-2018-0045395 A | 5/2018 |
| KR | 10-2018-0067243 A | 6/2018 |
| TW | 201730671 A | 9/2017 |
| TW | 201821457 A | 6/2018 |
| WO | WO 2017-092650 A * | 6/2017 |
| WO | WO 2017/146336 A1 | 8/2017 |
| WO | WO 2018/080008 A1 | 5/2018 |
| WO | WO 2018/110864 A1 | 6/2018 |

OTHER PUBLICATIONS

Taiwanese Patent Office Search Report with English Translation for corresponding Taiwanese Patent Application No. 107139455 dated Jul. 15, 2019 which was attached to the Notice of Allowance dated Jul. 19, 2019, 2 pages.
Taiwanese Patent Search Report for corresponding Taiwanese Patent Application No. 107145563, dated Aug. 14, 2019, which was attached to the Taiwanese Patent Office Action dated Aug. 15, 2019, 4 pages.
Office Action issued in U.S. Appl. No. 16/209,782 by the USPTO, dated May 22, 2020, 12 pages.
U.S. Notice of Allowance dated Aug. 25, 2020, issued in U.S. Appl. No. 16/209,782 (9 pages).
Korean Notice of Allowance dated Aug. 3, 2020, corresponding to Korean Patent Application No. 10-2018-0076671 (6 pages).

* cited by examiner

*Primary Examiner* — John A McPherson
(74) *Attorney, Agent, or Firm* — Lewis Roca Rothgerber Christie LLP

(57) ABSTRACT

A photosensitive resin composition for producing a photosensitive resin film is provided, along with the manufactured photosensitive resin film and a color filter including the photosensitive resin layer. The photosensitive resin composition includes: (A) a quantum dot; (B) a binder resin having a weight average molecular weight of about 2,000 g/mol to about 12,000 g/mol; (C) a photopolymerizable monomer; (D) a photopolymerization initiator; and (E) a solvent.

16 Claims, 19 Drawing Sheets

PHOTOSENSITIVE RESIN COMPOSITION, PHOTOSENSITIVE RESIN LAYER USING THE SAME, AND COLOR FILTER

CROSS-REFERENCE TO RELATED APPLICATION

This application claims priority to and the benefit of Korean Patent Application Nos. 10-2018-0014639 and 10-2018-0076672, filed in the Korean Intellectual Property Office on Feb. 6, 2018 and Jul. 2, 2018, respectively, the entire content of each of which is incorporated herein by reference.

BACKGROUND

1. Field

One or more aspects of embodiments of the present disclosure relate to a photosensitive resin composition, a photosensitive resin film manufactured using the same, and a color filter including the photosensitive resin film.

2. Description of the Related Art

A color filter for a display device may be formed using a photosensitive resist composition. The filter may be formed into a desired pattern through an exposure process using a photomask, after which the non-exposed regions are dissolved and removed through a development process. The materials used in the color filter may be subject to several requirements, including alkali-solubility (e.g., solubility in alkali solutions), high sensitivity, adherence to a substrate, chemical resistance, heat resistance, and/or the like. However, the materials used in the color filter are often not sufficiently cured during the photo exposure, and thus require additional thermal curing at temperatures greater than or equal to 200° C. in order to obtain the required characteristics. Accordingly, materials for the color filter are limited by their incompatibility with devices requiring low temperature processes (such as electronic paper, OLEDs, and/or the like).

Previous attempts have been made to remedy the insufficient photocuring characteristics of photosensitive resin compositions by adding compounds (groups) such as epoxide, peroxide, and/or the like to enable low temperature curing. However, such attempts did not secure sufficient curing and were found to have low reliability.

Without being bound by the correctness of any particular theory or explanation, the problem may occur because colorants for the filter (such as a pigment, a dye, and/or the like) compete with the photopolymerization initiator to absorb light energy. In addition, the photosensitive resin composition may not have sufficient initiation efficiency (e.g., may have a relatively low initiation efficiency), and may accordingly exhibit a lower photomonomer curing rate than a comparative filter without the colorant, because the pigment and/or dye may remove (e.g., scavenge) radicals produced by the initiator.

Accordingly, photosensitive resin compositions having improved reliability in terms of characteristics such as chemical resistance, heat resistance, and/or the like are desired.

SUMMARY

One or more aspects of embodiments of the present disclosure are directed to a quantum dot-containing photosensitive resin composition including a binder resin having a particular structure and weight average molecular weight that can increase curing in the lower parts of the layer and thus improve an undercut phenomenon (e.g., reduce generation of an undercut profile) and a development margin of a pattern (e.g., improve the resolution and precision of the pattern).

Additional aspects of embodiments of the present disclosure are directed to a photosensitive organic film (layer) manufactured using the photosensitive resin composition. Additional aspects of embodiments of the present disclosure are directed to a color filter including the photosensitive organic film and a display device including the color filter.

One or more aspects of embodiments of the present disclosure provides a photosensitive resin composition including: (A) a quantum dot; (B) a binder resin including a structural unit represented by Chemical Formula 1-1, a structural unit represented by Chemical Formula 1-2, a structural unit represented by Chemical Formula 1-3, and structural units represented by Chemical Formula 2 at terminal ends of the binder resin; (C) a photopolymerizable monomer; (D) a photopolymerization initiator; and (E) a solvent, wherein the binder resin has a weight average molecular weight of about 2,000 g/mol to about 12,000 g/mol:

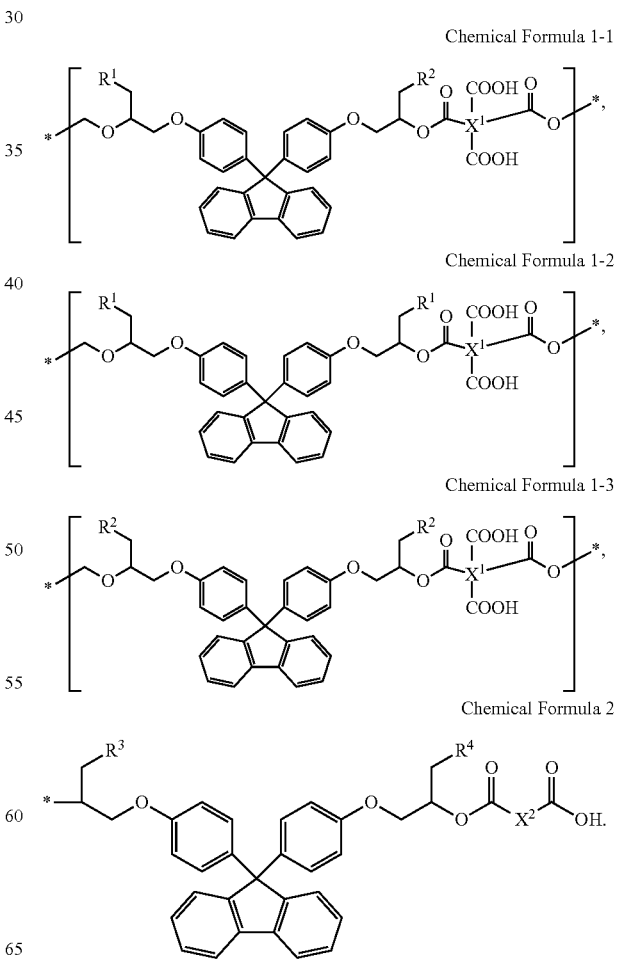

In Chemical Formula 1-1, Chemical Formula 1-2, Chemical Formula 1-3, and Chemical Formula 2, $R^1$ may be a substituted or unsubstituted acrylate group, $R^2$ may be a substituted or unsubstituted C6 to C20 thioaryl group, $R^3$ and $R^4$ may each be a substituted or unsubstituted C6 to C20 thioaryl group, $X^1$ may be a substituted or unsubstituted tetravalent organic group, and $X^2$ may be a substituted or unsubstituted divalent organic group.

In some embodiments, $X^1$ may be represented by one of Chemical Formula X-1 to Chemical Formula X-3:

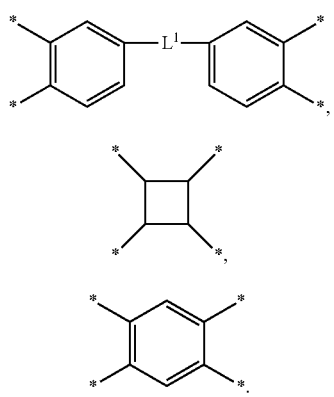

Chemical Formula X-1

Chemical Formula X-2

Chemical Formula X-3

In Chemical Formula X-1, $L^1$ may be a single bond (e.g., a direct linkage), an oxygen atom (O), a sulfur atom (S), *—C(=O)—*, or *—$CR^{a1}R^{a2}$—*, wherein $R^{a1}$ and $R^{a2}$ may each independently be a halogen-substituted or unsubstituted C1 to C10 alkyl group.

In Chemical Formula 2, $X^2$ may be represented by one of Chemical Formula X-4 to Chemical Formula X-10:

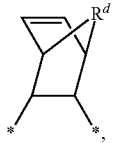

Chemical Formula X-4

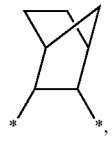

Chemical Formula X-5

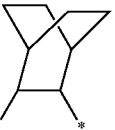

Chemical Formula X-6

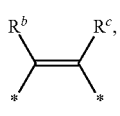

Chemical Formula X-7

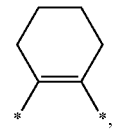

Chemical Formula X-8

Chemical Formula X-9

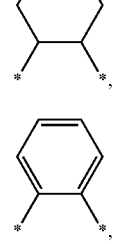

Chemical Formula X-10

In Chemical Formula X-4, $R^b$ and $R^c$ may each independently be a hydrogen atom (H), a substituted or unsubstituted C1 to C20 alkyl group, an ester group, or an ether group.

In Chemical Formula X-8, $R^d$ may be an oxygen atom (O), a sulfur atom (S), an amino group NH, a substituted or unsubstituted C1 to C20 alkylene group, a C1 to C20 alkylamine group, or a C2 to C20 alkenylamine group. In some embodiments, the photosensitive resin composition may further include a scatterer. The scatterer may include barium sulfate, calcium carbonate, titanium dioxide, zirconia, or a combination thereof.

In some embodiments, the photosensitive resin composition may further include a thiol-based additive. The thiol-based additive may include at least two functional groups represented by Chemical Formula 3 at terminal ends of the thiol-based additive:

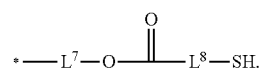

Chemical Formula 3

In Chemical Formula 3, $L^7$ and $L^8$ may each independently be a single bond (e.g., direct linkage), a substituted or unsubstituted C1 to C20 alkylene group, a substituted or unsubstituted C3 to C20 cycloalkylene group, a substituted or unsubstituted C6 to C20 arylene group, or a substituted or unsubstituted C2 to C20 heteroarylene group.

In some embodiments, the quantum dot may be to absorb light of about 360 nm to about 780 nm and may be to emit fluorescence of about 500 nm to about 700 nm.

In some embodiments, the photosensitive resin composition may further include a polymerization inhibitor.

In some embodiments, the polymerization inhibitor may be included in an amount of about 0.1 wt % to about 1.0 wt % based on a total solid amount of the photosensitive resin composition.

In some embodiments, the polymerization inhibitor may include a hydroquinone-based compound, a catechol-based compound, or a combination thereof.

In some embodiments, the photosensitive resin composition may include about 1 wt % to about 20 wt % of (A) the quantum dot; about 1 wt % to about 30 wt % of (B) the binder resin; about 1 wt % to about 15 wt % of (C) the photopolymerizable monomer; about 0.1 wt % to about 5 wt % of (D) the photopolymerization initiator; and a balance amount of (E) the solvent based on a total amount of the photosensitive resin composition.

In some embodiments, the photosensitive resin composition may further include malonic acid; 3-amino-1,2-propanediol; a silane-based coupling agent; a leveling agent; a fluorine-based surfactant; or a combination thereof.

One or more embodiments of the present disclosure provide a photosensitive resin film manufactured using the photosensitive resin composition.

One or more embodiments of the present disclosure provide a color filter including the photosensitive resin film. One or more embodiments of the present disclosure provide a display device including the color filter.

The quantum dot-containing photosensitive resin composition according to embodiments of the present disclosure may be capable of minimizing or reducing generation of an undercut profile while maintaining desired optical characteristics by using a selected functional group within an acryl-based or cardo-based binder resin and restricting the weight average molecular weight of the binder resin.

BRIEF DESCRIPTION OF THE DRAWINGS

The accompanying drawings together with the specification illustrate embodiments of the subject matter of the present disclosure, and together with the description, serve to explain principles of embodiments of the subject matter of the present disclosure.

DETAILED DESCRIPTION

Figure 1:
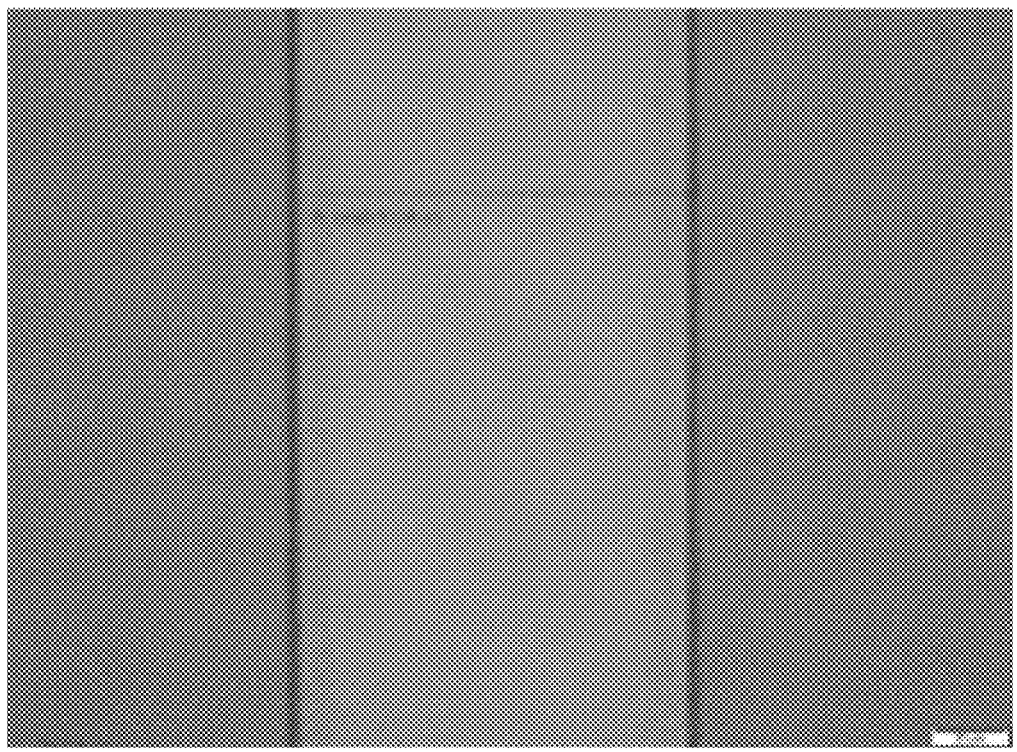
FIG. 1 is an optical microscope image showing a pattern of a photosensitive resin film formed of a composition according to Example 1.

Hereinafter, embodiments of the present invention are described in more detail with reference to the accompanying drawings, in which example embodiments of the disclosure are shown. However, these embodiments are exemplary; the present invention is not limited thereto and the present invention is defined by the scope of claims. As those skilled in the art would realize, the described embodiments may be modified in various different ways, all without departing from the spirit or scope of the present disclosure.

In the drawings, the thicknesses of layers, films, panels, regions, etc., may be exaggerated for clarity. Like reference numerals designate like elements throughout the specification and duplicative descriptions thereof will not be provided. It will be understood that when an element such as a layer, film, region, or substrate is referred to as being "on" another element, it can be directly on the other element or intervening element(s) may also be present. In contrast, when an element is referred to as being "directly on" another element, no intervening elements are present.

Expressions such as "at least one of", "one of", "selected from", "at least one selected from", and "one selected from", when preceding a list of elements, modify the entire list of elements and do not modify the individual elements of the list. Further, the use of "may" when describing embodiments of the inventive concept refers to "one or more embodiments of the inventive concept".

As used herein, when a specific definition is not otherwise provided, the term "alkyl group" may refer to a C1 to C20 alkyl group, the term "alkenyl group" may refer to a C2 to C20 alkenyl group, the term "cycloalkenyl group" may refer to a C3 to C20 cycloalkenyl group, the term "heterocycloalkenyl group" may refer to a C3 to C20 heterocycloalkenyl group, the term "aryl group" may refer to a C6 to C20 aryl group, the term "arylalkyl group" may refer to a C6 to C20 arylalkyl group, the term "alkylene group" may refer to a C1 to C20 alkylene group, the term "arylene group" may refer to a C6 to C20 arylene group, the term "alkylarylene group" may refer to a C6 to C20 alkylarylene group, the term "heteroarylene group" may refer to a C3 to C20 heteroarylene group, and the term "alkoxylene group" may refer to a C1 to C20 alkoxylene group.

As used herein, when a specific definition is not otherwise provided, the term "substituted" may refer to substitution with a halogen atom (F, Cl, Br, I), a hydroxy group, a C1 to C20 alkoxy group, a nitro group, a cyano group, an amine group, an imino group, an azido group, an amidino group, a hydrazino group, a hydrazono group, a carbonyl group, a carbamyl group, a thiol group, an ester group, an ether group, a carboxyl group or a salt thereof, a sulfonic acid group or a salt thereof, a phosphoric acid group or a salt thereof, a C1 to C20 alkyl group, a C2 to C20 alkenyl group, a C2 to C20 alkynyl group, a C6 to C20 aryl group, a C3 to C20 cycloalkyl group, a C3 to C20 cycloalkenyl group, a C3 to C20 cycloalkynyl group, a C2 to C20 heterocycloalkyl group, a C2 to C20 heterocycloalkenyl group, a C2 to C20 heterocycloalkynyl group, a C3 to C20 heteroaryl group, or a combination thereof, instead of (in place of) at least one hydrogen.

As used herein, when a specific definition is not otherwise provided, the term "hetero" may refer to substitution of at least one carbon atom with at least one hetero atom (e.g., nitrogen (N), oxygen (O), sulfur (S), and phosphorus (P)), in a chemical formula.

As used herein, when a specific definition is not otherwise provided, the term "(meth)acrylate" may refer to both "acrylate" and "methacrylate", and the term "(meth)acrylic acid" may refer to "acrylic acid" and "methacrylic acid".

As used herein, when a specific definition is not otherwise provided, the term "combination" may refer to mixing (e.g., a mixture of two or more discrete elements) or copolymerization (e.g., the product of an intermolecular reaction between two or more elements).

As used herein, unless a specific definition is otherwise provided, when a chemical bond or substituent is not explicitly drawn, a hydrogen atom is understood to be present at that position.

As used herein, when a specific definition is not otherwise provided, "*" indicates a connection point to another atom, group, or Chemical Formula, which may be the same as or different from the depicted structure or formula.

A photosensitive resin composition according to an embodiment of the present disclosure may include: (A) a quantum dot; (B) a binder resin having a weight average molecular weight of about 2,000 g/mol to about 12,000 g/mol and including a structural unit represented by Chemical Formula 1-1, a structural unit represented by Chemical Formula 1-2, a structural unit represented by Chemical Formula 1-3, and structural units represented by Chemical Formula 2 at terminal ends of the binder resin; (C) a photopolymerizable monomer; (D) a photopolymerization initiator; and (E) a solvent:

Chemical Formula 1-1

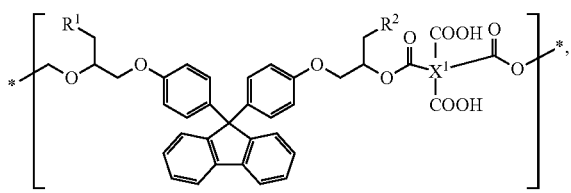

Chemical Formula 1-2

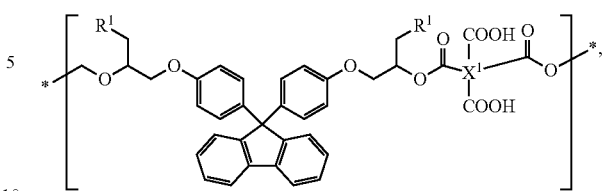

Chemical Formula 1-3

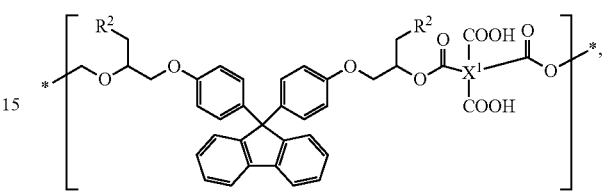

Chemical Formula 2

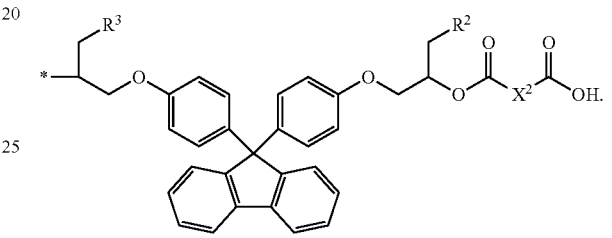

In Chemical Formula 1-1, Chemical Formula 1-2, Chemical Formula 1-3 and Chemical Formula 2, $R^1$ may be a substituted or unsubstituted acrylate group, $R^2$ may be a substituted or unsubstituted C6 to C20 thioaryl group, $R^3$ and $R^4$ may each be a substituted or unsubstituted C6 to C20 thioaryl group, $X^1$ may be a substituted or unsubstituted tetravalent organic group, and $X^2$ may be a substituted or unsubstituted divalent organic group.

One or more embodiments of the present disclosure relate to a color filter composition including a quantum dot (quantum dots). The quantum dot-containing photosensitive resin composition can be applied to a quantum dot-containing display, and may include basic components similar to those used in related art photoresist compositions (e.g., non-quantum dot-containing photosensitive resin compositions), (such as a photosensitive monomer, a binder resin, a photopolymerization initiator, a solvent, and an additive), in addition to a quantum dot (quantum dots) as a material for color characteristics (colorant) instead of a pigment and/or dye, as well as a light scatterer and/or the like. The quantum dot has a function of converting incident blue light into red light and green light after the quantum dot-containing photosensitive resin composition is formed into a film.

Non-limiting and representative examples of quantum dots include CdSe, InP, and/or the like. The effective use of the quantum dot-containing photosensitive resin composition may depend on maintaining the patterning properties of the composition along with the photoefficiency of the quantum dot even after a series of processing steps, for example, thermal prebaking, exposure, development, washing, deposition, thermal post-baking, and/or the like.

The quantum dot may carry out photoconversion of blue light. The quantum dot is surrounded with a hydrophobic ligand (e.g., is conjugated with a surface layer of hydrophobic ligands or groups), and when the hydrophobic quantum dot is added to a hydrophilic photoresist composition, dispersion of quantum dots may be deteriorated or decreased. Accordingly, much research has been carried out on ligand substitution and quantum dot surface passivation in order to solve this dispersion problem. Because the quantum dot-containing photosensitive resin composition has a lower sensitivity to patterning compared to related art color photoresist materials, a high sensitivity initiator may be used in excess (e.g., relatively large) amounts during a patterning process. However, when the high sensitivity initiator is included in an excess amount, the quantum dot-containing photosensitive resin composition shows increased pattern sensitivity but is cured only on the surface and not the lower part, resulting in generation of a severe undercut profile. In addition, as the amount of the photopolymerization initiator is increased, the quantum dot efficiency may be deteriorated or decreased by a radical generated by the photopolymerization initiator.

In addition, since the quantum dot-containing photosensitive resin composition includes inorganic particles in an amount of greater than or equal to about 50% based on a total amount of a solid (e.g., based on the total solid weight), the composition includes a relatively small amount of organic material, and thus the processibility of a film formed from the composition may be deteriorated. For example, developability and the melting characteristics of the film may be deteriorated during the post-baking process, such that it is difficult to form a pattern in the film in a forward direction.

In related art photoresists, the tendency to generate an undercut profile has been improved (decreased) by applying a binder resin having a low melting point (such as a cardo-based binder resin) to a composition, developing the composition, and post-baking the undercut, or for example, by introducing an epoxy group to the binder resin to reinforce a close-contacting force in the pre-baking process. However, the present quantum dot-containing photosensitive resin composition differs from a related art color photoresist material in that it includes a large amount of inorganic material, as described above. The quantum dot-containing photosensitive resin composition shows no melting characteristics (does not melt) during post-baking with a cardo-based binder resin alone, and thus improvement in the undercut problem may be limited. Further, when the quantum dot-containing photosensitive resin composition is used with a binder resin including an epoxy group, the residue characteristics are deteriorated (e.g., the composition leaves residues). In addition, since an acryl-based binder resin deteriorates the quantum dot efficiency of the composition, the quantum dot-containing photosensitive resin composition cannot be used with an acryl-based binder resin.

According to one or more embodiments of the present disclosure, the patterning characteristics of the quantum dot-containing photosensitive resin composition may be improved by introducing a photocurable vinyl group into the binder resin, thereby minimizing generation of an undercut profile after development. Simultaneously, the patterning characteristics of the quantum dot-containing photosensitive resin composition may be improved by introducing a thioaryl group at both terminal ends of the binder resin to increase curing of the lower part of the film, and thus suppress generation of an undercut profile. In addition, the development margin characteristics and photo characteristics of the film may be improved. Furthermore, the developability of the film may be improved by limiting a weight average molecular weight of the binder resin to about 2,000 g/mol to about 12,000 g/mol.

Hereinafter, each component is described in more detail.

(A) Quantum Dot

The quantum dot may absorb light (may be to absorb light) having a wavelength of about 360 nm to about 780 nm, for example, about 400 nm to about 780 nm, and may emit fluorescence (may be to emit fluorescence) having a wavelength of about 500 nm to about 700 nm, for example, about 500 nm to about 580 nm, or about 600 nm to about 680 nm. In some embodiments, the photo-conversion material may have a maximum fluorescence wavelength (fluorescence $\lambda_{em}$) of about 500 nm to about 680 nm.

Each quantum dot may independently have a full width at half maximum (FWHM) parameter of about 20 nm to about 100 nm, for example, about 20 nm to about 50 nm. When the quantum dot has a full width at half maximum (FWHM) within the above ranges, the quantum dot may have high color purity and may increase color reproducibility when used as a colorant in a color filter.

Each quantum dot may independently be an organic material, an inorganic material, or a hybrid (mixture) of the organic material and the inorganic material.

Each quantum dot may independently include a core, and a shell surrounding the core. The core and the shell may have any suitable structure and composition, such as a core independently comprising II-IV group elements, III-V group elements, and/or the like, a core/shell structure, a core/first shell/second shell structure, an alloy, an alloy/shell structure, and/or the like, but embodiments of the present disclosure are not limited thereto.

For example, the core may include at least one material selected from CdS, CdSe, CdTe, ZnS, ZnSe, ZnTe, HgS, HgSe, HgTe, GaN, GaP, GaAs, InP, InAs, and alloys thereof, but embodiments of the present disclosure are not necessarily limited thereto. The shell surrounding the core may include at least one material selected from CdSe, ZnSe, ZnS, ZnTe, CdTe, PbS, TiO, SrSe, HgSe, and alloys thereof, but embodiments of the present disclosure are not necessarily limited thereto.

In some embodiments, for environmental and regulatory reasons, a non-cadmium-based light emitting material (e.g., InP/ZnS) having a relatively low quantum efficiency (quantum yield) but being relatively environmentally benign may be used in place of a cadmium-based material. However, embodiments of the present disclosure are not necessarily limited thereto.

The size of the quantum dot is not particularly limited, and in some embodiments, the quantum dot having a core/shell structure may have an average overall diameter, including the shell (an average particle diameter) of about 1 nm to about 15 nm, for example, about 5 nm to about 15 nm.

In some embodiments, for example, the quantum dot may independently include a red quantum dot, a green quantum dot, or a combination thereof. The red quantum dot may independently have an average particle diameter of about 10 nm to about 15 nm. The green quantum dot may independently have an average particle diameter of about 5 nm to about 8 nm.

In some embodiments, for dispersion stability of the quantum dot, the photosensitive resin composition may further include a dispersing agent. The dispersing agent may help uniform dispersion of a photoconversion material (such as a quantum dot) in the photosensitive resin composition, and may include a non-ionic, anionic, or cationic dispersing agent. For example, the dispersing agent may be a polyalkylene glycol or an ester thereof, a polyoxy alkylene, a polyhydric alcohol ester alkylene oxide addition product, an alcohol alkylene oxide addition product, a sulfonate ester, a sulfonate salt, a carboxylate ester, a carboxylate salt, an alkyl amide alkylene oxide addition product, an alkyl amine, and/or the like, each of which may be used alone or in a mixture of two or more. The dispersing agent may be included in an amount of about 0.1 wt % to about 100 wt %, for example, about 10 wt % to about 20 wt % relative to the solid content of the photoconversion material (such as a quantum dot).

The quantum dot may be included in an amount of about 1 wt % to about 20 wt %, for example, about 5 wt % to about 15 wt % based on a total solid amount of the photosensitive resin composition according to an embodiment of the present disclosure. When the quantum dot is included within these ranges, a photoconversion rate is improved and excellent processability may be achieved without decreasing (e.g., while limiting decreases in) the quality of the film during patterning and development.

(B) Binder Resin

The binder resin includes the structural unit represented by Chemical Formula 1-1, the structural unit represented by Chemical Formula 1-2, the structural unit represented by Chemical Formula 1-3, and the structural units represented by Chemical Formula 2 at terminal ends of the binder resin.

The binder resin includes photocurable vinyl and thioaryl groups in its structure so that generation of an undercut profile may be decreased. Simultaneously, a development margin of the film may be improved by limiting a position of the vinyl group and the thioaryl group inside and at the terminal ends, respectively of the binder resin.

For example, when the thioaryl group is not present at both terminal ends of the binder resin, the photo characteristics of the binder resin (such as its photo-maintenance rate) may be deteriorated, and when the vinyl group is not present inside the binder resin, its patterning properties may be much deteriorated due to generation of an undercut profile.

For example, the vinyl group may function as a curing site and may be included in an amount of greater than or equal to about 25%, for example, about 25% to about 80% based on a total amount or concentration of functional groups inside the binder resin. When the vinyl group is included within these ranges, a lower portion of the layer may be more readily cured during the UV curing, and thus the undercut problem may be solved.

In some embodiments, the vinyl group may be a vinyl group constituting an acrylate group.

In Chemical Formula 1-1 to Chemical Formula 1-3, $X^1$ may be represented by one of Chemical Formula X-1 to Chemical Formula X-3:

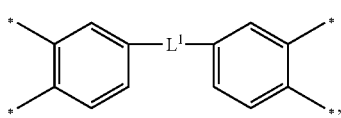

Chemical Formula X-1

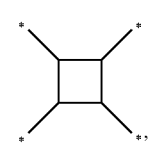

Chemical Formula X-2

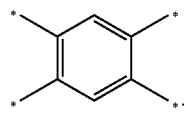

Chemical Formula X-3

In Chemical Formula X-1,
$L^1$ may be a single bond, an oxygen atom, a sulfur atom, $*$—C(=O)—$*$, or $*$—CR$^{a1}$R$^{a2}$—$*$, (wherein R$^{a1}$ and R$^{a2}$ are independently a halogen-substituted or unsubstituted C1 to C10 alkyl group).

For example, in Chemical Formula X-1, $L^1$ may be a sulfur atom.

In Chemical Formula 2, $X^2$ may be represented by one of Chemical Formula X-4 to Chemical Formula X-10:

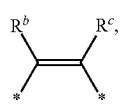

Chemical Formula X-4

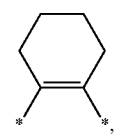

Chemical Formula X-5

Chemical Formula X-6

Chemical Formula X-7

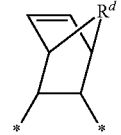

Chemical Formula X-8

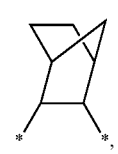

Chemical Formula X-9

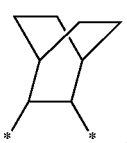

Chemical Formula X-10

In Chemical Formula X-4, R$^b$ and R$^c$ may each independently be a hydrogen atom, a substituted or unsubstituted C1 to C20 alkyl group, an ester group, or an ether group.

In Chemical Formula X-8, R$^d$ may be O, S, NH, a substituted or unsubstituted C1 to C20 alkylene group, a C1 to C20 alkylamine group, or a C2 to C20 alkenylamine group.

The binder resin may have a weight average molecular weight of about 2,000 g/mol to about 12,000 g/mol. When the weight average molecular weight of the binder resin is within these ranges, a pattern may be well formed without a residue during manufacture of a color filter and without loss of a film thickness during development. For example, when the binder resin has a weight average molecular weight of less than about 2,000 g/mol, a polymer may not be formed, but when the binder resin has a weight average molecular weight of greater than about 12,000 g/mol, a film formed of the composition may be delaminated and dissolved during KOH development, thus generating impurities.

The binder resin may be included in an amount of about 1 wt % to about 30 wt %, for example, about 5 wt % to about 20 wt % based on a total amount of the photosensitive resin composition. When the binder resin is included within these ranges, excellent sensitivity, developability, resolution and linearity of a pattern may be obtained.

(C) Photopolymerizable Monomer

In some embodiments, the photopolymerizable monomer may be a mono-functional or multi-functional ester of (meth)acrylic acid including at least one ethylenic unsaturated double bond.

When photopolymerizable monomer includes an ethylenic unsaturated double bond, polymerization may occur to a sufficient or suitable degree during exposure to a pattern-forming process, thereby resulting in a pattern having excellent heat resistance, light resistance, and/or chemical resistance.

Non-limiting examples of the photopolymerizable monomer include ethylene glycol di(meth)acrylate, diethylene glycol di(meth)acrylate, triethylene glycol di(meth)acrylate, propylene glycol di(meth)acrylate, neopentyl glycol di(meth)acrylate, 1,4-butanediol di(meth)acrylate, 1,6-hexanediol di(meth)acrylate, bisphenol A di(meth)acrylate, pentaerythritol di(meth)acrylate, pentaerythritol tri(meth)acrylate, pentaerythritol tetra(meth)acrylate, pentaerythritol hexa(meth)acrylate, dipentaerythritol di(meth)acrylate, dipentaerythritol tri(meth)acrylate, dipentaerythritol penta(meth)acrylate, dipentaerythritol hexa(meth)acrylate, bisphenol-A epoxy(meth)acrylate, ethylene glycol monomethylether (meth)acrylate, trimethylolpropane tri(meth)acrylate, tris(meth)acryloyloxyethyl phosphate, novolac epoxy (meth)acrylate, and/or the like.

Non-limiting examples of commercially available photopolymerizable monomer products are as follows. Non-limiting examples of the mono-functional ester of (meth)acrylic acid may include Aronix M-101®, M-111®, and M-114® (Toagosei Chemistry Industry Co., Ltd., Japan); KAYARAD TC-110S® and TC-120S® (Nippon Kayaku Co., Ltd., Tokyo, Japan); V-158® and V-2311® (Osaka Organic Chemical Ind., Ltd., Osaka, Japan), and/or the like. Non-limiting examples of a di-functional ester of (meth)acrylic acid may include Aronix M-210®, M-240®, and M-6200® (Toagosei Chemistry Industry Co., Ltd.); KAYARAD HDDA®, HX-220®, and R-604® (Nippon Kayaku Co., Ltd.); V-260®, V-312®, and V-335 HP® (Osaka Organic Chemical Ind., Ltd.), and/or the like. Non-limiting examples of a tri-functional ester of (meth)acrylic acid may include Aronix M-309®, M-400®, M-405®, M-450®, M-7100®, M-8030®, and M-8060® (Toagosei Chemistry Industry Co., Ltd.); KAYARAD TMPTA®, DPCA-20®, DPCA-30®, DPCA-60®, and DPCA-120® (Nippon Kayaku Co., Ltd.); V-295®, V-300®, V-360®, V-GPT®, V-3PA®, and V-400® (Osaka Yuki Kayaku Kogyo Co. Ltd.), and/or the like The photopolymerizable monomers may be used alone or in a mixture of two or more.

In some embodiments, the photopolymerizable monomer compound may be treated with acid anhydride to improve developability.

The photopolymerizable monomer may be included in an amount of about 1 wt % to about 15 wt % based on a total amount of the photosensitive resin composition. For example, the photopolymerizable monomer may be included in an amount of about 3 wt % to about 15 wt % based on a total solid content of the photosensitive resin composition. When the photopolymerizable monomer is included within these ranges, the photopolymerizable monomer may be sufficiently cured during exposure to a pattern-forming process, thus improving the reliability, heat resistance, light resistance, chemical resistance, resolution, and/or close contacting properties of a pattern.

(D) Photopolymerization Initiator

The photopolymerization initiator may include any suitable initiator in the photosensitive resin composition. For example, the photopolymerization initiator may include an acetophenone-based compound, a benzophenone-based compound, a thioxanthone-based compound, a benzoin-based compound, a triazine-based compound, an oxime-based compound, and/or the like.

Non-limiting examples of the acetophenone-based compound may include 2,2'-diethoxy acetophenone, 2,2'-dibutoxy acetophenone, 2-hydroxy-2-methylpropiophenone, p-t-butyltrichloro acetophenone, p-t-butyldichloro acetophenone, 4-chloro acetophenone, 2,2'-dichloro-4-phenoxy acetophenone, 2-methyl-1-(4-(methylthio)phenyl)-2-morpholinopropan-1-one, 2-benzyl-2-dimethylamino-1-(4-morpholinophenyl)-butan-1-one, and/or the like.

Non-limiting examples of the benzophenone-based compound may include benzophenone, benzoyl benzoate, benzoyl methyl benzoate, 4-phenyl benzophenone, hydroxybenzophenone, acrylated benzophenone, 4,4'-bis(dimethylamino)benzophenone, 4,4'-bis(diethylamino)benzophenone, 4,4'-dimethylaminobenzophenone, 4,4'-dichlorobenzophenone, 3,3'-dimethyl-2-methoxybenzophenone, and/or the like.

Non-limiting examples of the thioxanthone-based compound may include thioxanthone, 2-methylthioxanthone, isopropyl thioxanthone, 2,4-diethyl thioxanthone, 2,4-diisopropyl thioxanthone, 2-chiorothioxanthone, and/or the like.

Non-limiting examples of the benzoin-based compound may include benzoin, benzoin methyl ether, benzoin ethyl ether, benzoin isopropyl ether, benzoin isobutyl ether, benzyldimethylketal, and/or the like.

Non-limiting examples of the triazine-based compound may include 2,4,6-trichloro-s-triazine, 2-phenyl-4,6-bis(trichloromethyl)-s-triazine, 2-(3',4'-dimethoxystyryl)-4,6-bis(trichloromethyl)-s-triazine, 2-(4'-methoxynaphthyl)-4,6-bis(trichloromethyl)-s-triazine, 2-(p-methoxyphenyl)-4,6-bis(trichloromethyl)-s-triazine, 2-(p-tolyl)-4,6-bis(trichloromethyl)-s-triazine, 2-biphenyl-4,6-bis(trichloromethyl)-s-triazine, bis(trichloromethyl)-6-styryl-s-triazine, 2-(naphtho1-yl)-4,6-bis(trichloromethyl)-s-triazine,2-(4-methoxynaphtho1-yl)-4,6-bis(trichloromethyl)-s-triazine, 2-4-bis(trichloromethyl)-6-piperonyl-s-triazine, 2-4-bis(trichloromethyl)-6-(4-methoxystyryl)-s-triazine, and/or the like.

Non-limiting examples of the oxime-based compound may include O-acyloxime-based compound, 2-(O-benzoyloxime)-1-[4-(phenylthio)phenyl]-1,2-octandione, 1-(O-acetyloxime)-1-[9-ethyl-6-(2-methylbenzoyl)-9H-carbazol-3-yl]ethanone, O-ethoxycarbonyl-α-oxyamino-1- phenylpropan-1-one, and/or the like. Non-limiting examples of the O-acyloxime-based compound may be 1,2-octandione, 2-dimethylamino-2-(4-methylbenzyl)-1-(4-morpholin-4-yl-phenyl)-butan-1-one, 1-(4-phenylsulfanyl phenyl)-butane-1,2-dione-2-oxime-O-benzoate, 1-(4-phenylsulfanyl phenyl)-octane-1,2-dione-2-oxime-O-benzoate, 1-(4-phenylsulfanyl phenyl)-octan-1-oneoxime-O-acetate, and/or 1-(4-phenylsulfanyl phenyl)butan-1-oneoxime-O-acetate. For example, the photopolymerization initiator of the photosensitive resin composition according to an embodiment of the present disclosure may be an oxime-based compound.

In some embodiments, the photopolymerization initiator may further include a carbazole-based compound, a diketone-based compound, a sulfonium borate-based compound, a diazo-based compound, an imidazole-based compound, a biimidazole-based compound, a fluorene-based compound, and/or the like.

The photopolymerization initiator may be used with a photosensitizer capable of causing a chemical reaction by absorbing light, becoming excited, and then transferring its energy (e.g., to a polymerizable molecule).

Non-limiting examples of the photosensitizer may include tetraethylene glycol bis-3-mercaptopropionate, pentaerythritol tetrakis-3-mercaptopropionate, dipentaerythritol tetrakis-3-mercaptopropionate, and/or the like.

The photopolymerization initiator may be included in an amount of about 0.1 wt % to about 5 wt %, for example about 0.1 wt % to about 1 wt % based on a total amount of the photosensitive resin composition. When the photopolymerization initiator is included within these ranges, excellent reliability may be secured due to sufficient curing during exposure in a pattern-forming process, and the patterned film may have excellent heat resistance, light resistance, chemical resistance, resolution, and/or a close contacting property. Further, the transmittance of the film may be prevented from deterioration or decrease due to a lack of reaction initiation.

(E) Solvent

The solvent may be any suitable solvent having compatibility with the quantum dot, and/or any suitable solvent having compatibility with the binder resin, the photopolymerizable monomer, the photopolymerization initiator, and other additives, and for example, does not react with any of these components.

Non-limiting examples of the solvent having compatibility with the quantum dot may include, for example, alkanes (R—H) (such as pentane, hexane, heptanes, and/or the like); aromatic hydrocarbons (Ar—H) (such as toluene, xylene, and/or the like); ethers (R—O—R) (such as diisoamyl ether, dibutyl ether, and/or the like); alkyl halides (R—X) (such as chloroform, trichloro methane, and/or the like); cycloalkanes (such as cyclopropane, cyclobutane, cyclopentane, cyclohexane, and/or the like); and/or the like, but embodiments of the present disclosure are not limited thereto.

Non-limiting examples of the solvent having compatibility with the binder resin, the photopolymerizable monomer, the photopolymerization initiator, and other additives may include, for example, alcohols (such as methanol, ethanol, and/or the like; glycol ethers such as ethylene glycol methylether, ethylene glycol ethylether, propylene glycol methylether, and/or the like); cellosolve acetates (such as methyl cellosolve acetate, ethyl cellosolve acetate, diethyl cellosolve acetate, and/or the like); carbitols (such as methylethyl carbitol, diethyl carbitol, diethylene glycol monomethylether, diethylene glycol monoethylether, diethylene glycol dimethylether, diethylene glycol methylethylether, diethylene glycol diethylether, and/or the like); propylene glycol alkylether acetates (such as propylene glycol monomethylether acetate, propylene glycol propylether acetate, and/or the like); ketones (such as methylethylketone, cyclohexanone, 4-hydroxy-4-methyl-2-pentanone, methyl-n-propylketone, methyl-n-butylketone, methyl-n-amylketone, 2-heptanone, and/or the like); saturated aliphatic monocarboxylic acid alkyl esters (such as ethyl acetate, n-butyl acetate, isobutyl acetate, and/or the like); lactic acid alkyl esters (such as methyl lactate, ethyl lactate, and/or the like); hydroxyacetic acid alkyl esters (such as methyl hydroxyacetate, ethyl hydroxyacetate, butyl hydroxyacetate, and/or the like); acetic acid alkoxyalkyl esters (such as methoxymethyl acetate, methoxyethyl acetate, methoxybutyl acetate, ethoxymethyl acetate, ethoxyethyl acetate, and/or the like); 3-hydroxypropionic acid alkyl esters (such as methyl 3-hydroxypropionate, ethyl 3-hydroxypropionate, and/or the like); 3-alkoxypropionic acid alkyl esters (such as methyl 3-methoxypropionate, ethyl 3-methoxypropionate, ethyl 3-ethoxypropionate, methyl 3-ethoxypropionate, and/or the like); 2-hydroxypropionic acid alkyl esters (such as methyl 2-hydroxypropionate, ethyl 2-hydroxypropionate, propyl 2-hydroxypropionate, and/or the like); 2-alkoxypropionic acid alkyl esters (such as methyl 2-methoxypropionate, ethyl 2-methoxypropionate, ethyl 2-ethoxypropionate, methyl 2-ethoxypropionate, and/or the like); 2-hydroxy-2-methylpropionic acid alkyl esters (such as methyl 2-hydroxy-2-methylpropionate, ethyl 2-hydroxy-2-methylpropionate, and/or the like); 2-alkoxy-2-methylpropionic acid alkyl esters (such as methyl 2-methoxy-2-methylpropionate, ethyl 2-ethoxy-2-methylpropionate, and/or the like); esters (such as 2-hydroxyethyl propionate, 2-hydroxy-2-methylethyl propionate, hydroxyethyl acetate, methyl 2-hydroxy-3-methylbutanoate, and/or the like); and ketonate ester compounds (such as ethyl pyruvate and/or the like). A high-boiling point solvent (such as N-methylformamide, N,N-dimethyl formamide, N-methylformanilide, N-methylacetamide, N,N-dimethyl acetamide, N-methylpyrrolidone, dimethylsulfoxide, benzylethylether, dihexylether, acetylacetone, isophorone, caproic acid, caprylic acid, 1-octanol, 1-nonanol, benzyl alcohol, benzyl acetate, ethyl benzoate, diethyl oxalate, diethyl maleate, γ-butyrolactone, ethylene carbonate, propylene carbonate, phenyl cellosolve acetate, and/or the like) may also be used, but embodiments of the present disclosure are not limited thereto.

Considering miscibility and reactivity, glycol ethers (such as ethylene glycol monoethylether, and/or the like); ethylene glycol alkylether acetates (such as ethyl cellosolve acetate, and/or the like); esters (such as 2-hydroxy ethyl propionate, and/or the like); carbitols (such as diethylene glycol monomethylether, and/or the like); and propylene glycol alkylether acetates (such as propylene glycol monomethylether acetate, propylene glycol propylether acetate, and/or the like) may be used.

The solvent having compatibility with the binder resin, the photopolymerizable monomer, the photopolymerization initiator, and other additives may be used (e.g., in a volume of) one to three times, for example one to twice as much as the solvent having compatibility with the quantum dot. Accordingly, the developability of the photosensitive resin composition with respect to an alkali developing solution may be effectively adjusted.

The solvent may be included in a balance amount, for example, about 20 wt % to about 80 wt % based on a total amount of the photosensitive resin composition. When the solvent is within this range, the photosensitive resin composition may have appropriate or suitable viscosity, and thus the processability of the resin may be improved during manufacturing of a color filter.

(F) Scatterer

The photosensitive resin composition according to an embodiment of the present disclosure may further include a scatterer.

For example, the scatterer may include barium sulfate ($BaSO_4$), calcium carbonate ($CaCO_3$), titanium dioxide ($TiO_2$), zirconia ($ZrO_2$), or a combination thereof.

The scatterer reflects light not absorbed by the above photo-conversion material (e.g., the quantum dot), so that the reflected light may be adsorbed again in the photo-conversion material. In other words, the scatterer increases the percentage of light absorbed by the photo-conversion material, thus increasing the photo-conversion efficiency of the photosensitive resin composition.

The scatterer may have an average particle diameter ($D_{50}$) of about 150 nm to about 250 nm, and for example about 180 nm to about 230 nm. When the scatterer has an average particle diameter within these ranges, improved light scattering effects may be obtained, and the photo-conversion efficiency of the resin and/or film may be increased.

The scatterer may be included in an amount of about 0.1 wt % to about 20 wt %, for example, about 1 wt % to about 10 wt % based on a total solid amount of the photosensitive resin composition. When the scatterer is included in an amount of less than 0.1 wt % based on a total solid amount of the photosensitive resin composition, the scattering effect and improved photo-conversion efficiency may be difficult to obtain. When the scatterer is included in an amount of greater than 20 wt %, the patterning characteristics of a color filter may be deteriorated, and the photo-conversion efficiency may also be deteriorated.

(G) Other Additives

In order to improve the stability and dispersibility of the quantum dot, the photosensitive resin composition according to an embodiment of the present disclosure may further include a thiol-based additive.

The thiol-based additive may replace the shell surface of the quantum dot, may improve the dispersion stability of a quantum dot in a solvent, and may stabilize the quantum dot.

The thiol-based additive may have 2 to 10 thiol groups, for example, 2 to 4 thiol groups (—SH) at terminal ends of the binder resin, depending on its structure.

For example, the thiol-based additive may include at least two functional groups represented by Chemical Formula 3 at the terminal end:

Chemical Formula 3

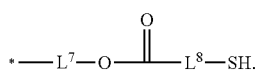

In Chemical Formula 3, $L^7$ and $L^8$ may each independently be a single bond, a substituted or unsubstituted C1 to C20 alkylene group, a substituted or unsubstituted C3 to C20 cycloalkylene group, a substituted or unsubstituted C6 to C20 arylene group, or a substituted or unsubstituted C2 to C20 heteroarylene group.

For example, the thiol-based additive may be represented by Chemical Formula 4:

Chemical Formula 4

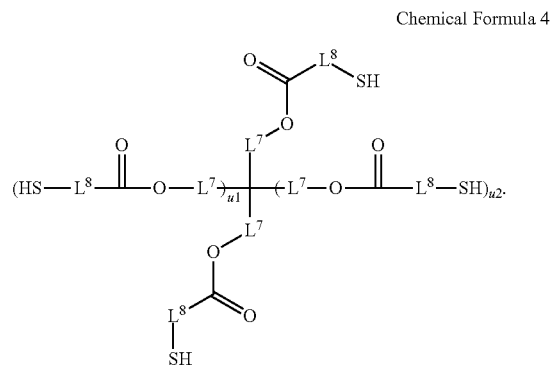

In Chemical Formula 4, $L^7$ and $L^8$ may each independently be a single bond, a substituted or unsubstituted C1 to C20 alkylene group, a substituted or unsubstituted C3 to C20 cycloalkylene group, a substituted or unsubstituted C6 to C20 arylene group, or a substituted or unsubstituted C2 to C20 heteroarylene group, and u1 and u2 may each independently be an integer of 0 or 1.

For example, in Chemical Formula 3 and Chemical Formula 4, the $L^7$ and $L^8$ may each independently be a single bond or a substituted or unsubstituted C1 to C20 alkylene group.

Non-limiting examples of the thiol-based additive may include pentaerythritol tetrakis(3-mercaptopropionate) represented by Chemical Formula 3a, trimethylolpropane tris (3-mercaptopropionate) represented by Chemical Formula 3b, pentaerythritol tetrakis(mercaptoacetate) represented by Chemical Formula 3c, trimethylolpropane tris(2-mercaptoacetate) represented by Chemical Formula 3d, glycol di-3-mercaptopropionate represented by Chemical Formula 3e, and combinations thereof:

Chemical Formula 3a

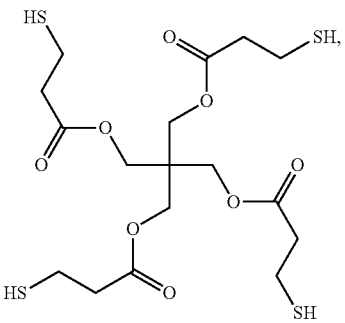

Chemical Formula 3b

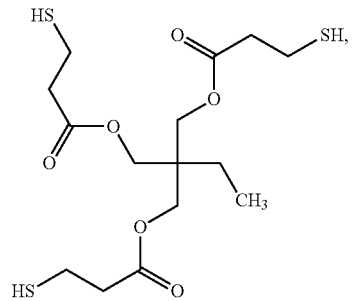

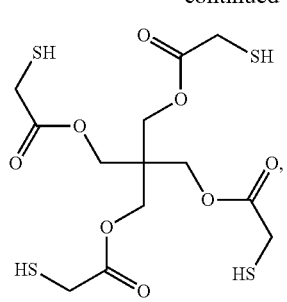

Chemical Formula 3c

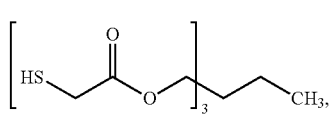

Chemical Formula 3d

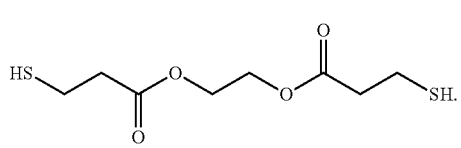

Chemical Formula 3e

The thiol-based additive may be included in an amount of about 0.1 wt % to about 10 wt %, for example, about 0.1 wt % to about 5 wt % based on a total amount of the photosensitive resin composition. For example, the thiol-based additive may be included in an amount of about 0.1 wt % to about 10 wt %, for example, about 0.5 wt % to about 8 wt % based on a total solid amount of the photosensitive resin composition. When the thiol-based additive is included within these ranges, the stability of a photo-conversion material (such as a quantum dot) may be improved. For example, the thiol group in the component may react with an acrylic group of a resin or a monomer to form a covalent bond, and the heat resistance of the photo-conversion material (such as a quantum dot) may be improved.

The photosensitive resin composition according to an embodiment of the present disclosure may further include a polymerization inhibitor.

In general, when a photosensitive resin composition for a color filter is coated and pre-baked on a substrate, a photo-polymerization initiator activated by heat during the pre-baking process generates a radical, and the radical may cross-link a photopolymerizable monomer and the above thiol-based additive and thus slowly cure the photosensitive resin composition.

After the pre-baking process and before exposure (e.g., to photocuring), the composition may be allowed to stand at room temperature for about one hour or so. However, when the composition is allowed to stand at room temperature for about 30 minutes or more, its development time may in general become greater than or equal to about 30 seconds longer, and when allowed to stand at room temperature for about 1 hour or longer, a non-development phenomenon occurs (e.g., the composition may fail to be developed), preventing patterning of the film. In addition, when a non-exposed region of the resin is cured, developability is much deteriorated, and accordingly, sensitivity may be also deteriorated.

However, when the photosensitive resin composition includes a polymerization inhibitor, the polymerization inhibitor may suppress a cross-linking reaction between the photopolymerizable monomer and the thiol-based additive, and thus solve the problem of not developing that arises after being allowed to stand at room temperature. For example, even when the composition is allowed to stand at room temperature for 2 hours or longer after coating and pre-baking, a uniform pattern may still be formed, regardless of development time.

The polymerization inhibitor may be included in an amount of about 0.01 wt % to about 2 wt % based on a total amount of the photosensitive resin composition. When the polymerization inhibitor is included in an amount of less than about 0.01 wt % based on a total amount of the solid, the problem of not developing after being allowed to stand at room temperature may not be solved. When the polymerization inhibitor is included in an amount of greater than about 2 wt %, sensitivity is deteriorated, and accordingly, patterning of the film may be difficult, and/or surface delamination may occur.

The polymerization inhibitor may include a hydroquinone-based compound, a catechol-based compound, or a combination thereof. For example, the polymerization inhibitor may include hydroquinone, methyl hydroquinone, t-butyl hydroquinone, 2,5-di-t-butyl hydroquinone, 2,5-bis(1,1-dimethylbutyl) hydroquinone, 2,5-bis(1,1,3,3-tetramethylbutyl) hydroquinone, catechol, t-butyl catechol, 4-methoxyphenol, pyrogallol, 2,6-di-t-butyl-4-methylphenol, 2-naphthol, tris(N-hydroxy-N-nitrosophenylaminato-O,O') aluminum, or a combination thereof, but embodiments of the present disclosure are not limited thereto.

The photosensitive resin composition according to an embodiment of the present disclosure may further include malonic acid; 3-amino-1,2-propanediol; a silane-based coupling agent; a leveling agent; a fluorine-based surfactant; or a combination thereof, besides the thiol-based additive.

For example, the photosensitive resin composition may further include a silane-based coupling agent having a reactive substituent (such as a vinyl group, a carboxyl group, a methacryloxy group, an isocyanate group, an epoxy group and/or the like) in order to improve close contacting properties with a substrate.

Non-limiting examples of the silane-based coupling agent may include trimethoxysilyl benzoic acid, γ-methacryl oxypropyl trimethoxysilane, vinyl triacetoxysilane, vinyl trimethoxysilane, γ-isocyanate propyl triethoxysilane, γ-glycidoxy propyl trimethoxysilane, β-(3,4-epoxycyclohexyp-ethyltrimethoxysilane, and/or the like, and these may be used alone or in a mixture of two or more.

The silane-based coupling agent may be used in an amount of about 0.01 parts by weight to about 10 parts by weight based on 100 parts by weight of the photosensitive resin composition. When the silane-based coupling agent is included within this range, close contacting properties, storage capability, and/or the like may be improved.

The photosensitive resin composition may further include a surfactant, for example, a fluorine-based surfactant as needed in order to improve coating properties and inhibit or reduce generation of spots.

Non-limiting examples of the fluorine-based surfactant may include BM-1000® and BM-1100® (BM Chemie Inc., Germany); MEGAFACE F 142D®, F 172®, F 173®, and F 183® (Dainippon Ink Kagaku Kogyo Co., Ltd., Tokyo, Japan); FULORAD FC-135®, FULORAD FC-170C®, FULORAD FC-430®, and FULORAD FC-431® (Sumitomo 3M Co., Ltd., Tokyo, Japan); SURFLON S-112®, SURFLON S-113®, SURFLON S-131®, SURFLON S-141®, and SURFLON S-145® (ASAHI Glass Co., Ltd., Tokyo, Japan); SH-28PA®, SH-190®, SH-193®, SZ-6032®, and SF-8428®, and/or the like (Toray Silicone Co., Ltd., Tokyo, Japan); and F-482, F-484, F-478, F-554, and/or the like (DIC Co., Ltd., Tokyo, Japan).

The fluorine-based surfactant may be included in an amount of about 0.001 parts by weight to about 5 parts by weight based on 100 parts by weight of the photosensitive resin composition. When the fluorine-based surfactant is included within this range, coating uniformity may be ensured, stains may not be generated, and wetting properties for a glass substrate may be improved.

The photosensitive resin composition may further include other additives (such as an antioxidant, a stabilizer, and/or the like) in a predetermined or set amount as long as they do not reduce the above-described properties.

Another embodiment of the present disclosure provides a photosensitive resin layer manufactured using the photosensitive resin composition.

A method of manufacturing the photosensitive resin layer is described in more detail.

(1) Coating and Film Formation Steps

The photosensitive resin composition is coated to have a desired or suitable thickness, for example, a thickness of about 1.2 μm to about 3.5 μm, on a substrate exposed to a set or predetermined pretreatment. The coating may be applied using a spin or slit coating method, a roll coating method, a screen-printing method, an applicator method, and/or the like, after which the coated substrate is heated at a temperature ranging from 70° C. to 90° C. for 1 minute to 10 minutes to remove the solvent, providing a film.

(2) Exposure Step

A mask with a set or predetermined shape to form a desired pattern is placed on the resultant film, and the film is irradiated by an actinic (e.g., violet or ultraviolet (UV)) ray having a wavelength of 200 nm to 500 nm. The radiation is performed using a suitable light source (such as a mercury lamp with a low pressure, a high pressure, or an ultrahigh pressure; a metal halide lamp; an argon gas laser; and/or the like). In some embodiments, an X-ray source, electron beam, and/or the like may be used.

In some embodiments, when a high pressure mercury lamp is used, a light dose of 500 mJ/cm$^2$ or less (with a 365 nm sensor) may be used. However, the light dose may vary depending on the components of the photosensitive resin composition, their combination ratios (amounts), and the thickness of the film.

(3) Development Step

After the exposure process, an alkali aqueous solution is used to develop the exposed film by dissolving and removing unnecessary parts of the film (e.g., parts that were not exposed to radiation), forming an image pattern.

(4) Post-Treatment Step

The developed image pattern may be repeatedly heated or irradiated by an actinic ray and/or the like for curing, in order to achieve excellent quality in terms of heat resistance, photo resistance, close contacting properties, crack-resistance, chemical resistance, high strength, storage stability, and/or the like.

Another embodiment of the present disclosure provides a color filter including the photosensitive resin layer.

Hereinafter, example embodiments of the present disclosure are described in more detail. These examples, however, are not in any sense to be interpreted as limiting the scope of the invention.

(Preparation of Photosensitive Resin Composition)

EXAMPLES 1 TO 4 AND COMPARATIVE EXAMPLES 1 AND 2

The photosensitive resin compositions according to Example 1 to Example 4 and Comparative Example 1 and Comparative Example 2 were each prepared using the following steps and the components shown in Table 1.

A photopolymerization initiator was dissolved in a solvent (E-2), and the solution was sufficiently stirred at room temperature for 2 hours. Subsequently, a photopolymerizable monomer, a binder resin, a surfactant, a dispersing agent, and a thiol-based additive were added thereto and mixed therewith for about 15 minutes, after which a polymerization inhibitor was injected thereinto, and the obtained mixture was stirred at room temperature for one hour. Meanwhile, a quantum dot and a dispersing agent were put in a solvent (E-1) and stirred at room temperature for 30 minutes to prepare a quantum dot solution. Then, the quantum dot solution was mixed with the solution including the dissolved photopolymerization initiator and the like, stirred for 30 minutes at room temperature, and filtered three times to remove impurities, thus preparing a photosensitive resin composition.

(A) Quantum Dot

InP/ZnSe/ZnS quantum dot (fluorescence $\lambda_{em}$=542 nm, FWHM=37 nm, Green QD, Hansol Chemical Co., Ltd., Seoul, South Korea)

(B) Binder Resin (B-1) A binder resin including a structural unit represented by Chemical Formula E-1, a structural unit represented by Chemical Formula E-2, a structural unit represented by Chemical Formula E-3, and a structural unit represented by Chemical Formula E-4 at both terminal ends of the binder resin (weight average molecular weight: 4,000 g/mol):

Chemical Formula E-1

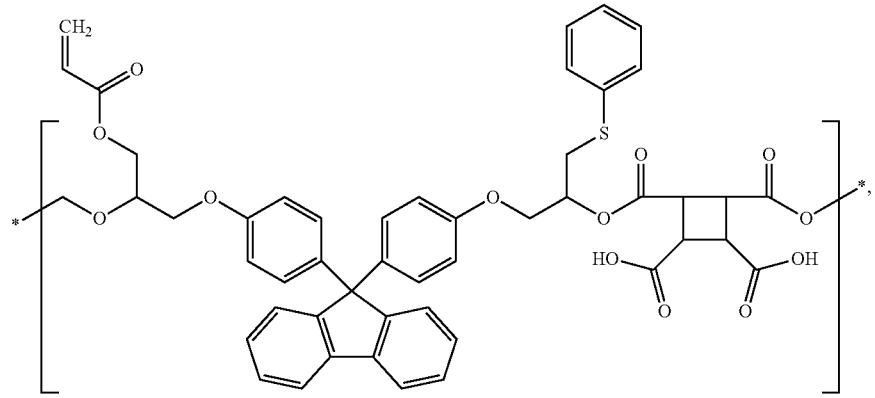

Chemical Formula E-2

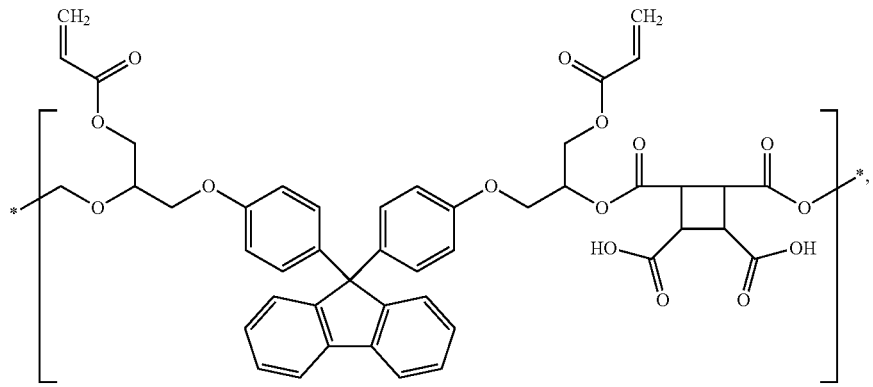

Chemical Formula E-3

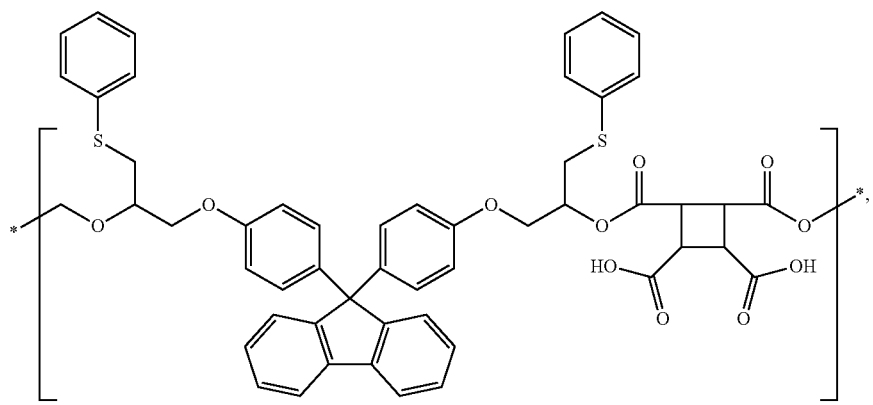

Chemical Formula E-4

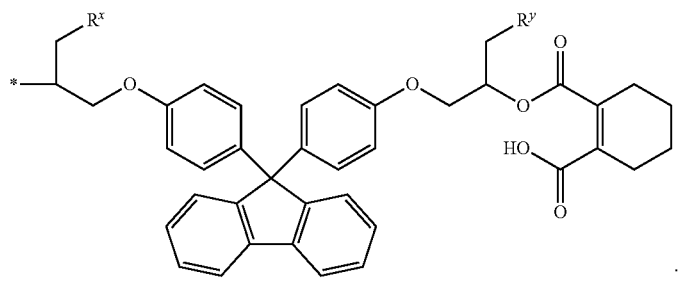

In Chemical Formula E-4, $R^x$ and $R^y$ are each unsubstituted thiophenyl group.

(B-2) A binder resin including a structural unit represented by Chemical Formula E-1, a structural unit represented by Chemical Formula E-2, a structural unit represented by Chemical Formula E-3, and a structural unit represented by Chemical Formula E-4 (weight average molecular weight: 4,500 g/mol)

(B-3) A binder resin including a structural unit represented by Chemical Formula E-1, a structural unit represented by Chemical Formula E-2, a structural unit represented by Chemical Formula E-3, and a structural unit represented by Chemical Formula E-4 (weight average molecular weight: 5,000 g/mol)

(B-4) A binder resin including a structural unit represented by Chemical Formula E-1, a structural unit represented by Chemical Formula E-2, a structural unit represented by Chemical Formula E-3, and a structural unit represented by Chemical Formula E-4 at both terminal ends of the binder resin (weight average molecular weight: 8,000 g/mol)

(B-5) A cardo-based binder resin (V259ME, NIPPON STEEL, Tokyo, Japan)

(B-6) A binder resin including a structural unit represented by Chemical Formula C-1 (weight average molecular weight: 5,000 g/mol):

Chemical Formula C-1

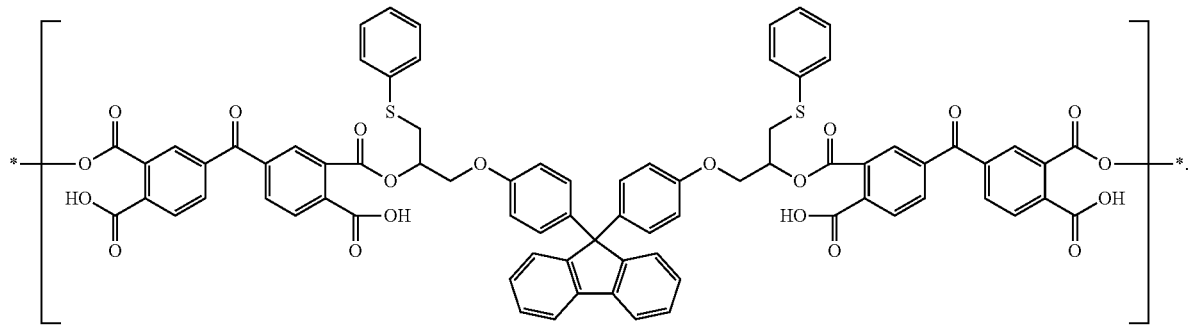

(C) Photopolymerizable Monomer
Dipentaerythritolhexaacrylate (Nippon Kayaku Co. Ltd., Tokyo, Japan)
(D) Photopolymerization Initiator
Oxime-based Initiator (PBG-305, Tronyl)
(E) Solvent
(E-1) Cyclohexanone (Sigma-Aldrich, St. Louis, Mo.)
(E-2) Propylene glycol monomethylether acetate (PGMEA) (Sigma-Aldrich, St. Louis, Mo.)
(F) Scatterer
Titanium Dioxide Dispersion (a $TiO_2$ solid content: 20 wt %, an average particle diameter: 200 nm, Ditto Technology, Gunpo, South Korea)
(G) Thiol-Based Additive
Glycoldi-3-mercaptopropionate (BRUNO BOCK, Marschacht, Germany)
(H) Polymerization Inhibitor
Methylhydroquinone (TOKYO CHEMICAL Industry Co., Tokyo, Japan)
(I) Other Additives
Fluorine-based Surfactant (F-554, DIC Co., Ltd., Tokyo, Japan)

Evaluation 1: Photo-Conversion Rate and Photo-Maintenance Rate of Quantum Dot 15 mL of each photosensitive resin composition according to Examples 1 to 4 and Comparative Examples 1 and 2 was respectively coated to a thickness of 6.0 μm on a glass substrate using a spin-coater (Opticoat MS-A150, Mikasa Co., Ltd., Tokyo, Japan) and pre-baked on a hot-plate at 100° C. for 2 minutes, after which the initial blue photo-conversion rates were measured (e.g., pre-baking).

Each photosensitive resin composition was UV irradiated using an exposer (a ghi broadband, Ushio Inc., Tokyo, Japan) with an output (power) of 100 $mJ/cm^2$ and post-baked at 180° C. for 30 minutes in a convection oven (Jong Ro Measuring Instruments Co., Ltd., Seoul, South Korea), after which the blue photo-conversion rate was again measured (e.g., post-baking).

The photo-conversion rate of incident blue light from a backlight unit (BLU) into red light and the photo-maintenance rate were both evaluated from the pre-baking and the post-baking measurements, and the results are shown in Table 2. The blue photo-conversion rate (red/blue) was measured using a CAS 140 CT spectrometer as a detector and specifically calculated by placing a bare piece of glass on a blue BLU covered with a diffusing film to serve as a reference, and placing a film respectively coated with each photosensitive resin composition according to Examples 1 to 4 and Comparative Examples 1 and 2 at the same position to obtain a conversion peak increase of blue light to red light relative to an absorption peak decrease of blue light. In addition, the photo-maintenance rate was calculated to show how much the photo-conversion rate just after prebaking was maintained after post-baking, for example, for the change from the prebaking to the post-baking.

TABLE 1

(unit: wt %)

| | | Example 1 | Example 2 | Example 3 | Example 4 | Comparative Example 1 | Comparative Example 2 |
|---|---|---|---|---|---|---|---|
| (A) Quantum dot | | 12 | 12 | 12 | 12 | 12 | 12 |
| (B) Binder resin | B-1 | 9 | — | — | — | — | — |
| | B-2 | — | 9 | — | — | — | — |
| | B-3 | — | — | 9 | — | — | — |
| | B-4 | — | — | — | 9 | — | — |
| | B-5 | — | — | — | — | 9 | — |
| | B-6 | — | — | — | — | — | 9 |
| (C) Photopolymerizable monomer | | 2 | 2 | 2 | 2 | 2 | 2 |
| (D) Photopolymerization initiator | | 0.3 | 0.3 | 0.3 | 0.3 | 0.3 | 0.3 |
| (E) Solvent | E-1 | 31 | 31 | 31 | 31 | 31 | 31 |
| | E-2 | 24 | 24 | 24 | 24 | 24 | 24 |
| (F) Scatterer | | 20 | 20 | 20 | 20 | 20 | 20 |
| (G) Thiol-based additive | | 1.5 | 1.5 | 1.5 | 1.5 | 1.5 | 1.5 |
| (H) Polymerization inhibitor | | 0.05 | 0.05 | 0.05 | 0.05 | 0.05 | 0.05 |
| (I) Other additive | | 0.15 | 0.15 | 0.15 | 0.15 | 0.15 | 0.15 |

TABLE 2

| | | Ex. 1 | Ex. 2 | Ex. 3 | Ex. 4 | Comp. Ex. 1 | Comp. Ex. 2 |
|---|---|---|---|---|---|---|---|
| Thickness (μm) | | 6.0 | 6.0 | 6.0 | 6.0 | 6.0 | 6.0 |
| Photo-conversion rate (%) | Pre-baking | 31.3 | 31.5 | 31.5 | 31.4 | 30.5 | 31.4 |
| | post-baking | 24.0 | 24.0 | 24.3 | 24.5 | 13.6 | 24.5 |
| Photo-maintenance rate (%) (post-baking/prebaking) | | 77 | 76 | 77 | 78 | 45 | 78 |

As shown in Table 2, Examples 1 to 4 showed excellent photo-conversion rates and photo-maintenance rates compared to Comparative Examples 1 and 2. For example, when a binder resin including no thioaryl group was used (e.g., in Comparative Example 1), the resulting film formed of a quantum dot-containing photosensitive resin composition showed a much deteriorated photo-maintenance rate after thermal treatment, and thus was difficult to thermally process.

Evaluation 2: Pattern Properties

Each photosensitive resin composition according to Examples 1 to 4 and

Figure 2:
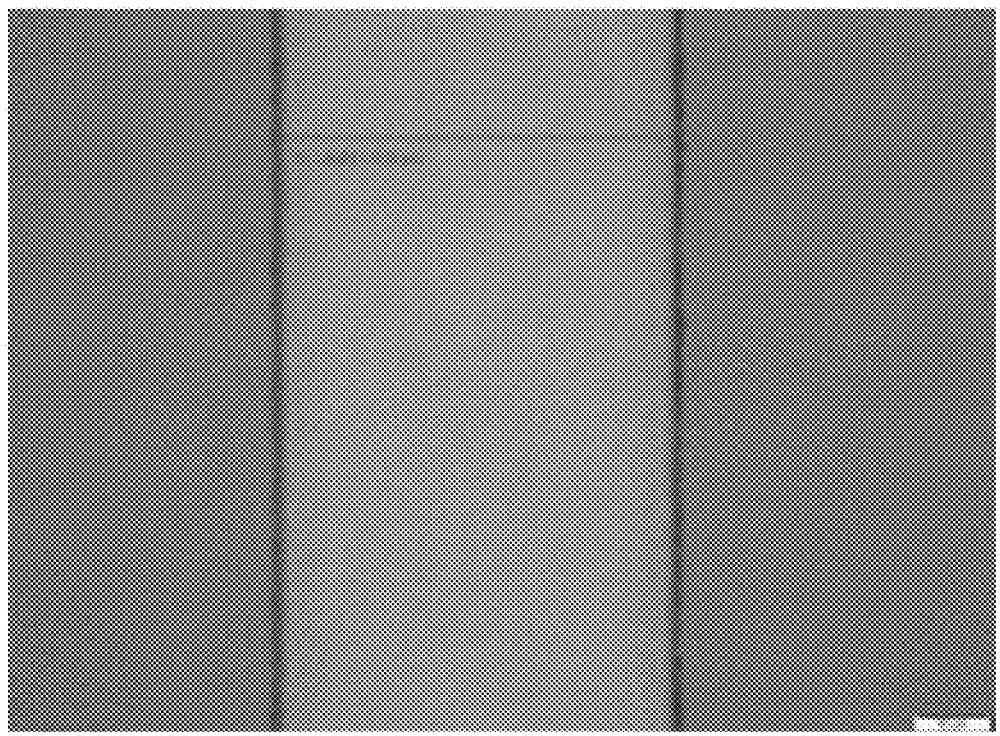
FIG. 2 is an optical microscope image showing a pattern of a photosensitive resin film formed of a composition according to Example 2.
Figure 3:
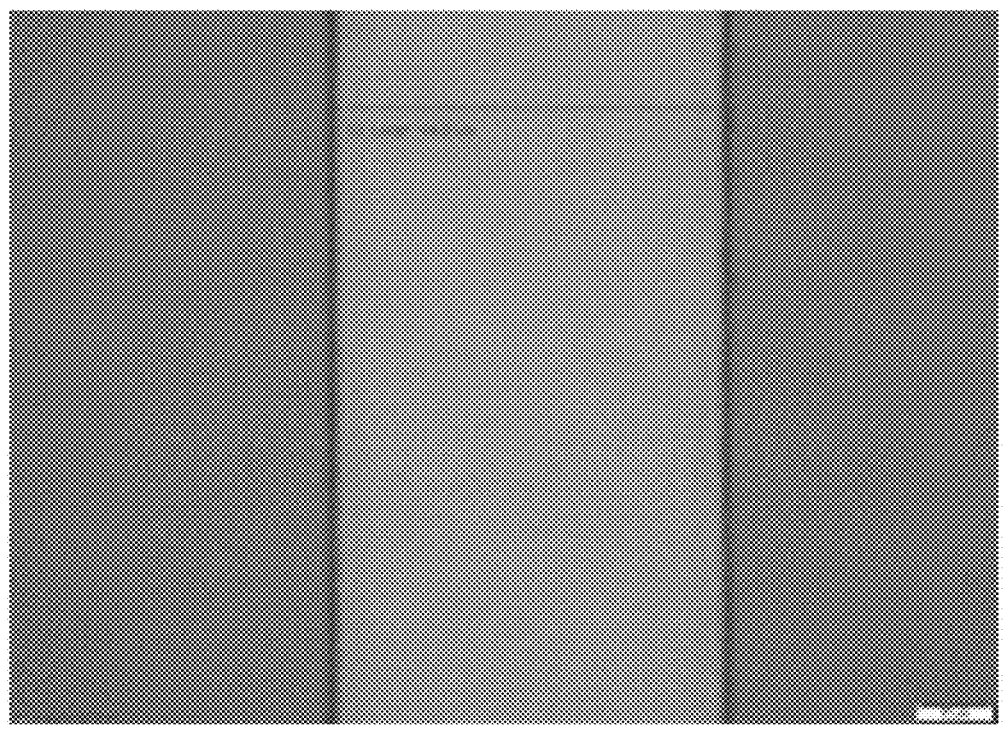
FIG. 3 is an optical microscope image showing a pattern of a photosensitive resin film formed of a composition according to Example 3.
Figure 4:
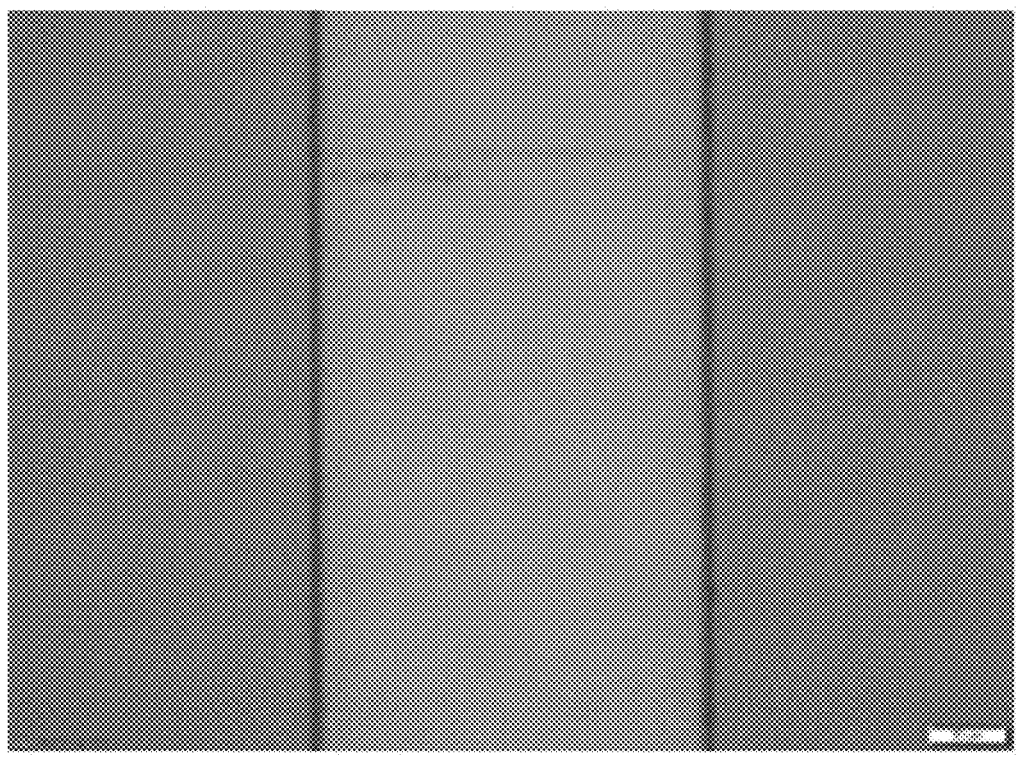
FIG. 4 is an optical microscope image showing a pattern of a photosensitive resin film formed of a composition according to Example 4.
Figure 5:
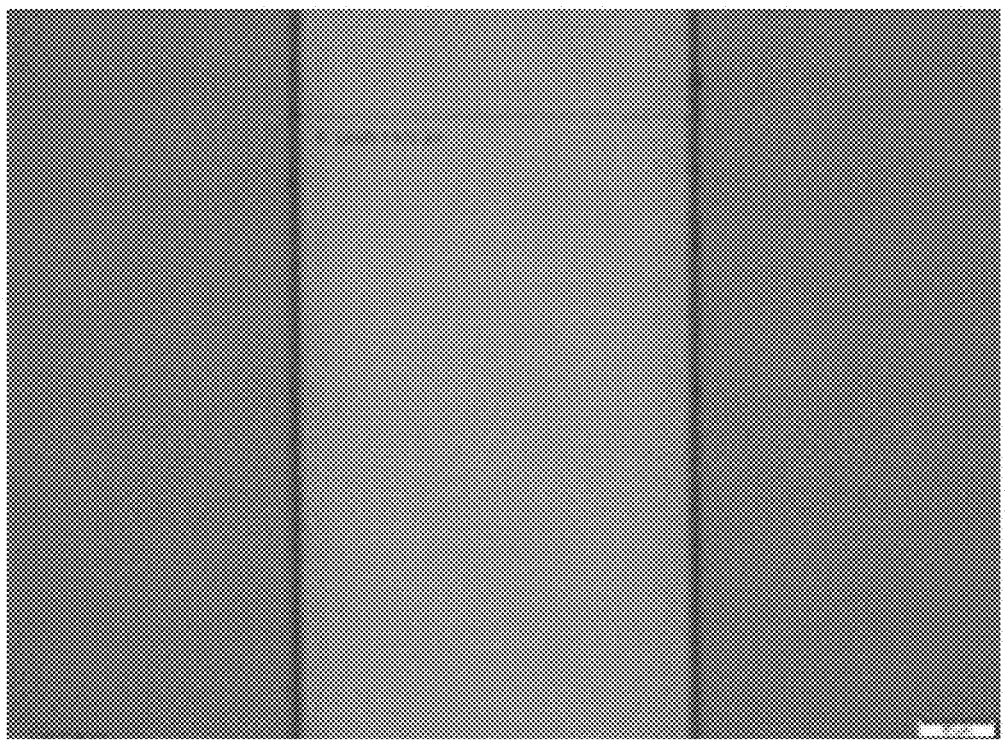
FIG. 5 is an optical microscope image showing a pattern of a photosensitive resin film formed of a composition according to Comparative Example 2.
Figure 6:
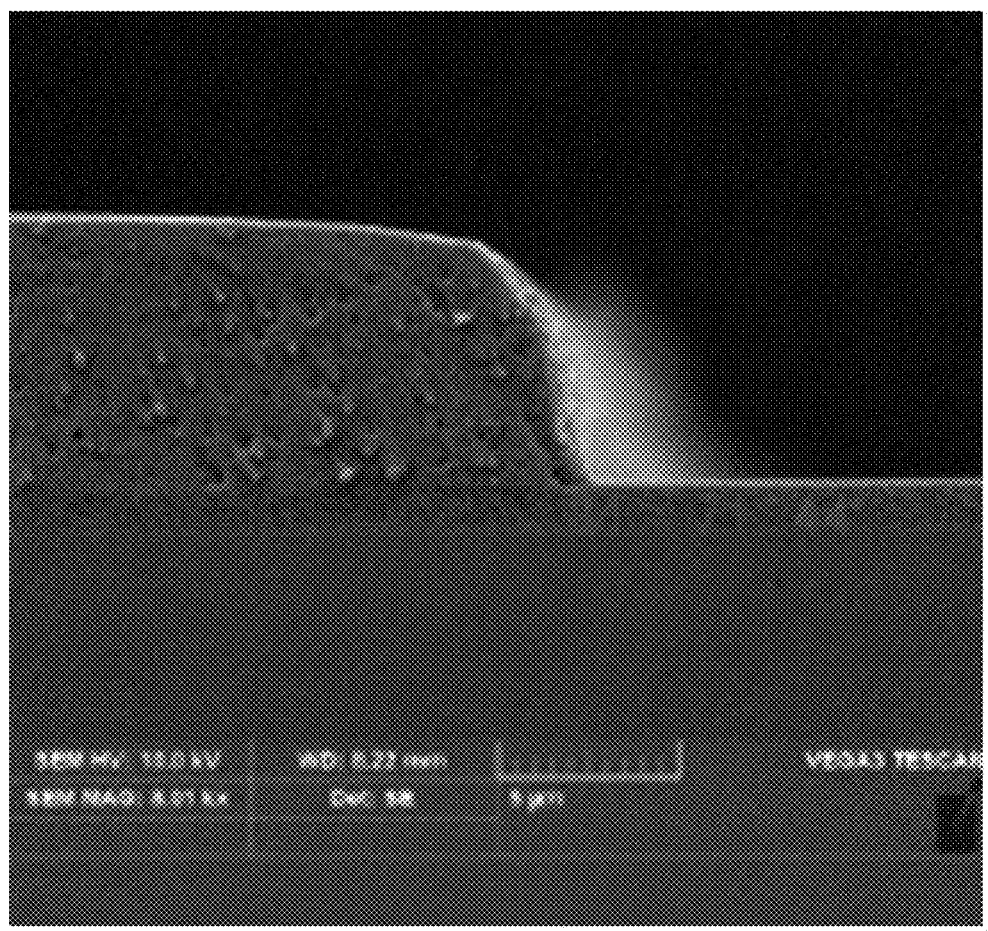
FIG. 6 is a scanning electron microscope (SEM) image showing a pattern of a photosensitive resin film after coating, exposing, and developing the composition of Example 1 on a substrate, prior to post-baking it.
Figure 7:
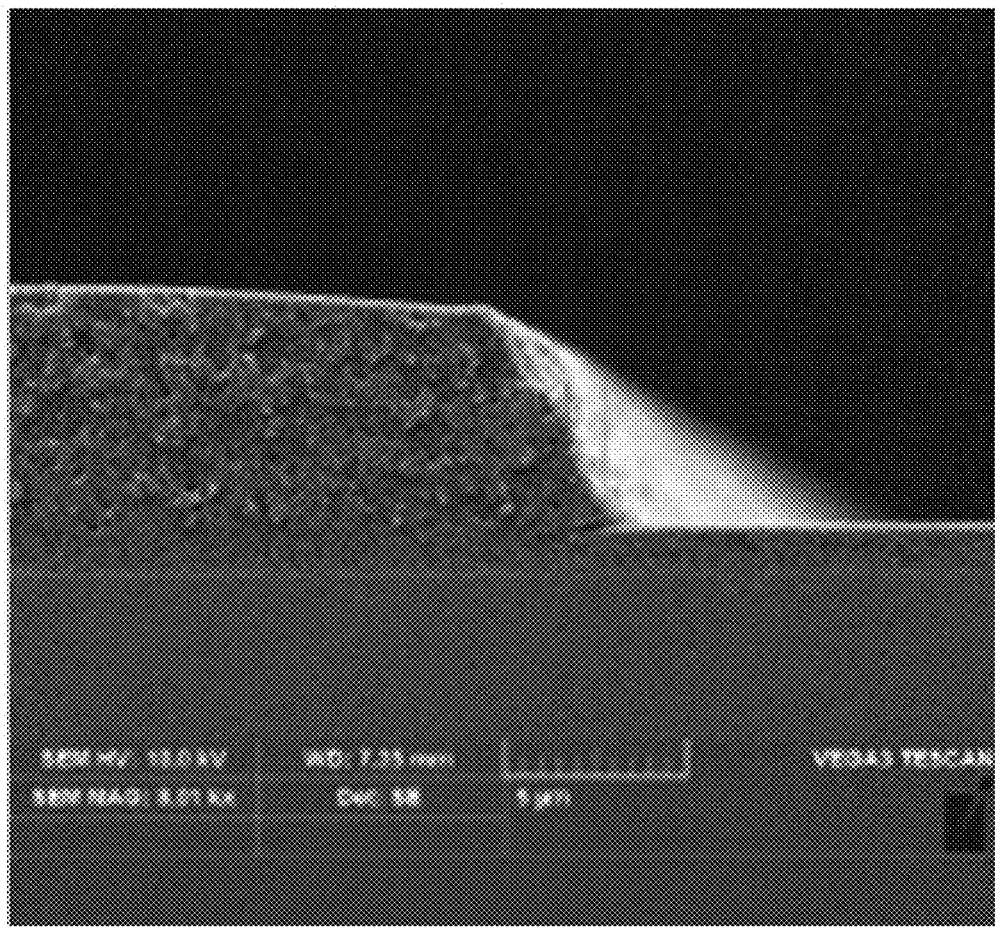
FIG. 7 is a SEM image showing a pattern of a photosensitive resin film right after coating, exposing, developing, and post-baking the composition of Example 1 on a substrate.
Figure 8:
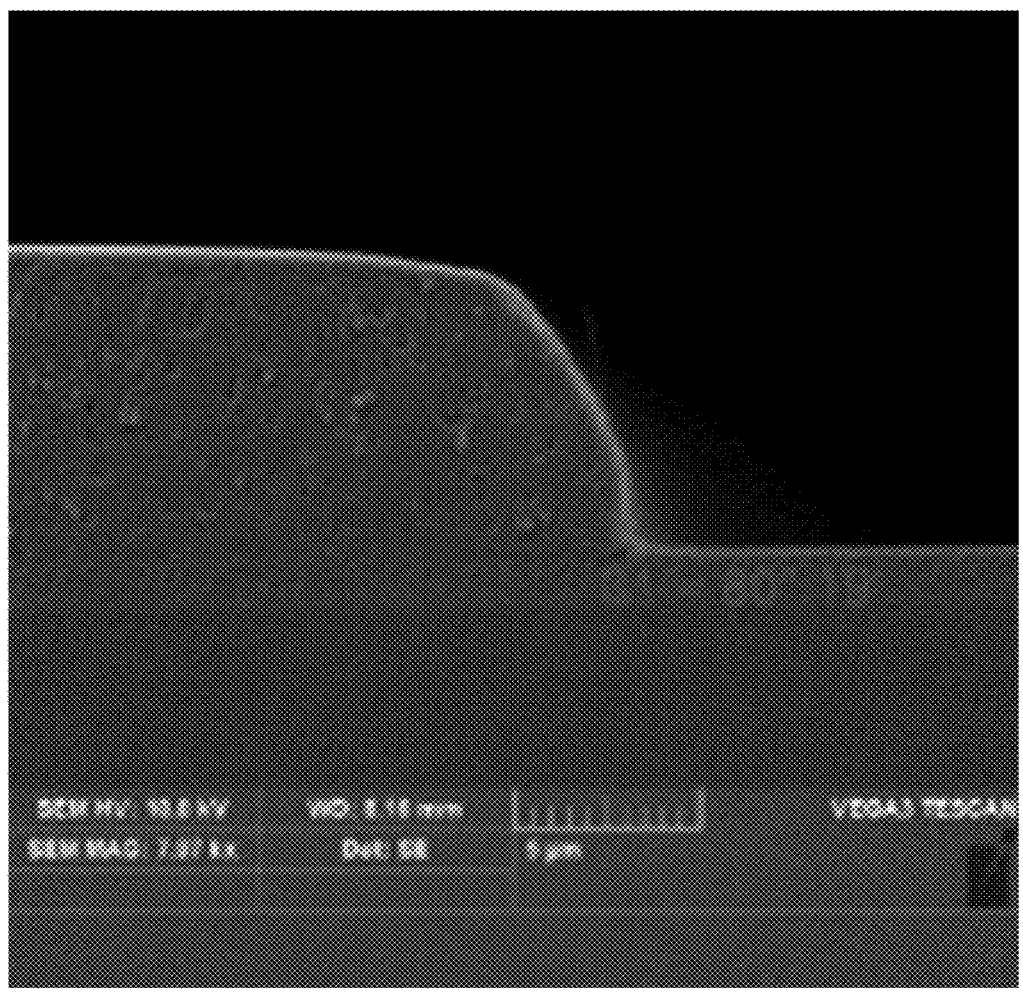
FIG. 8 is a SEM image showing a pattern of a photosensitive resin film after coating, exposing, and developing the composition of Example 2 on a substrate, prior to post-baking it.
Figure 9:
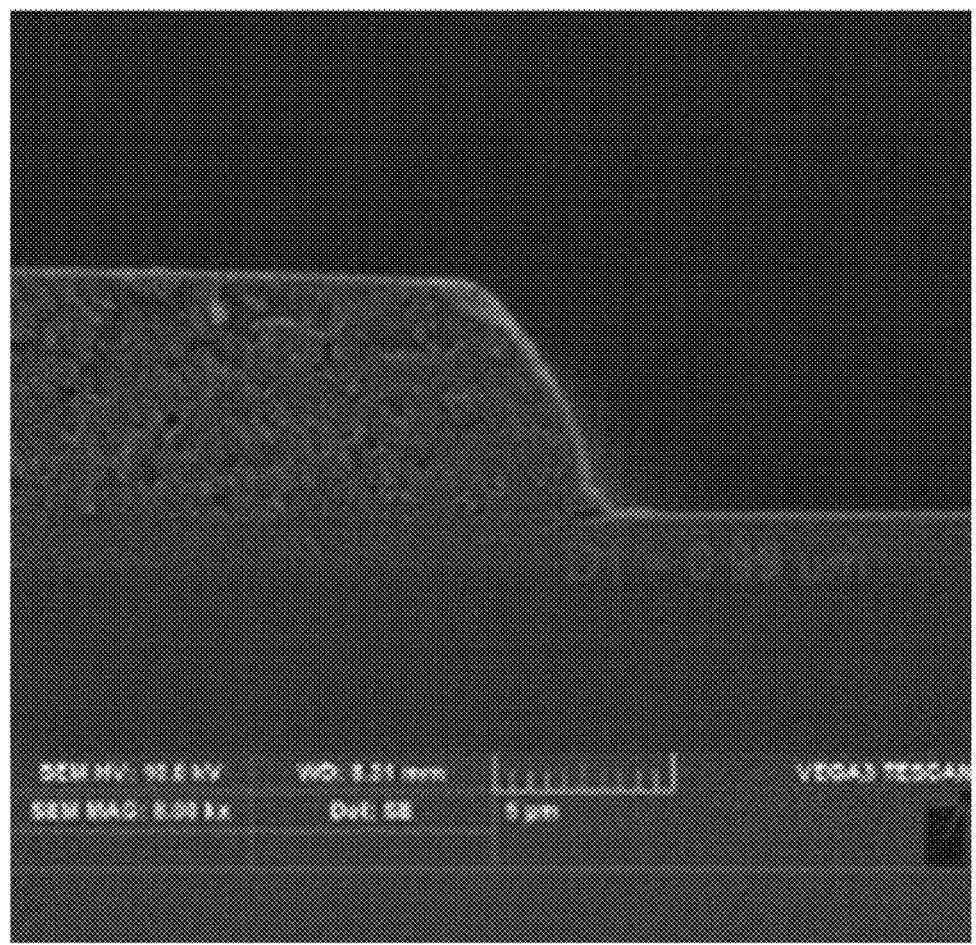
FIG. 9 is a SEM image showing a pattern of a photosensitive resin film after coating, exposing, developing, and post-baking the composition of Example 2 on a substrate.
Figure 10:
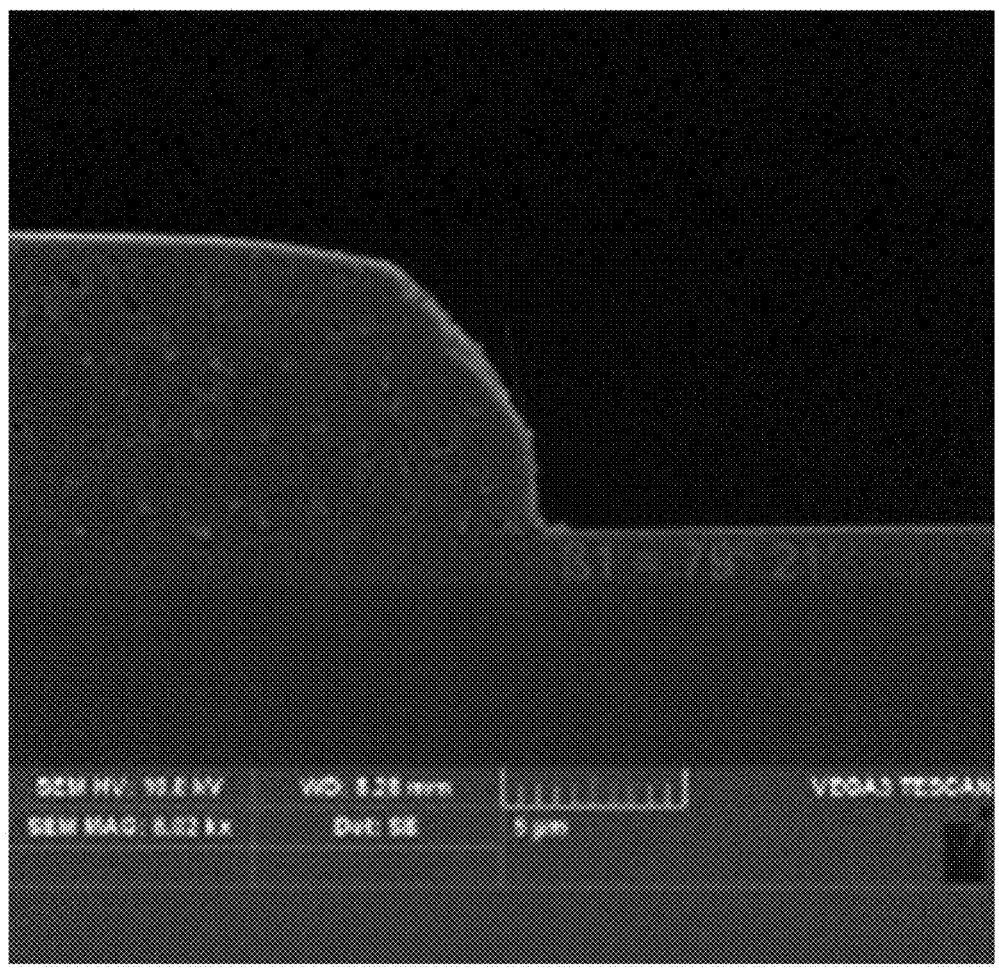
FIG. 10 is a SEM image showing a pattern of a photosensitive resin film right after coating, exposing, and developing the composition of Example 3 on a substrate, prior to post-baking it.
Figure 11:
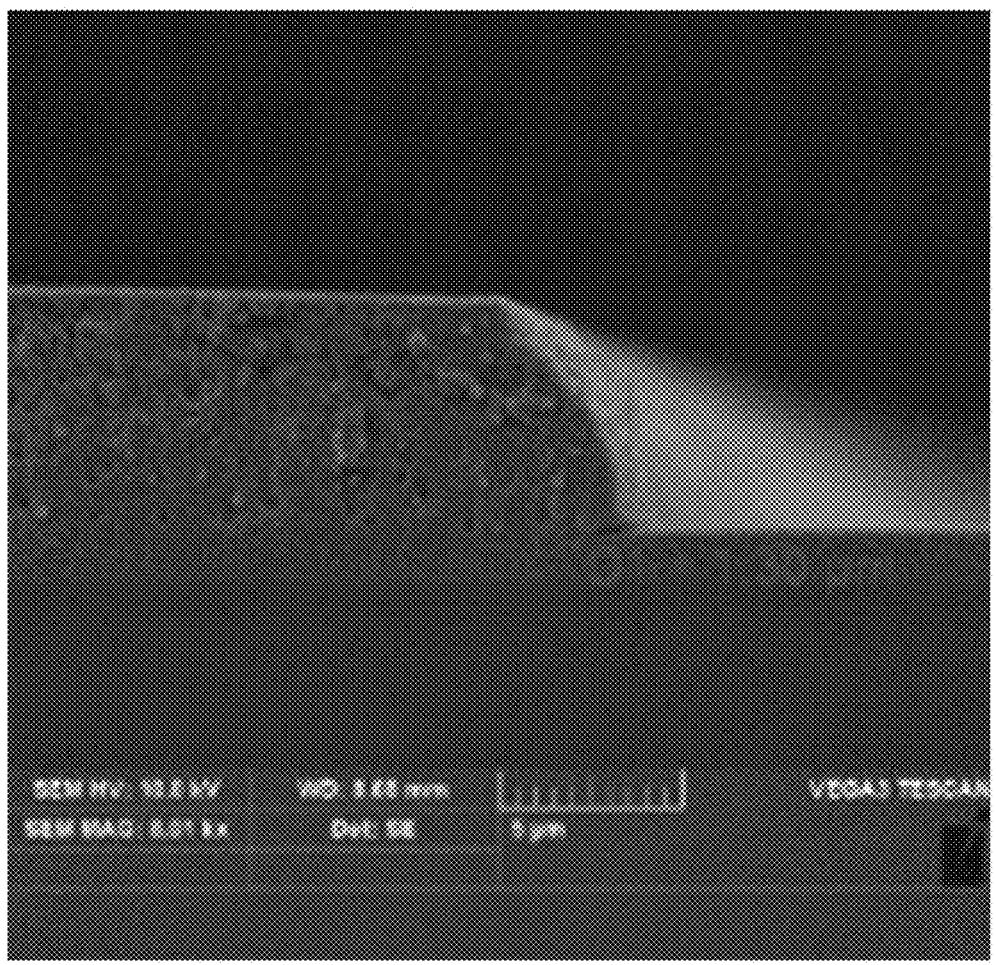
FIG. 11 is a SEM image showing a pattern of a photosensitive resin film right after coating, exposing, developing, and post-baking the composition of Example 3 on a substrate.
Figure 12:
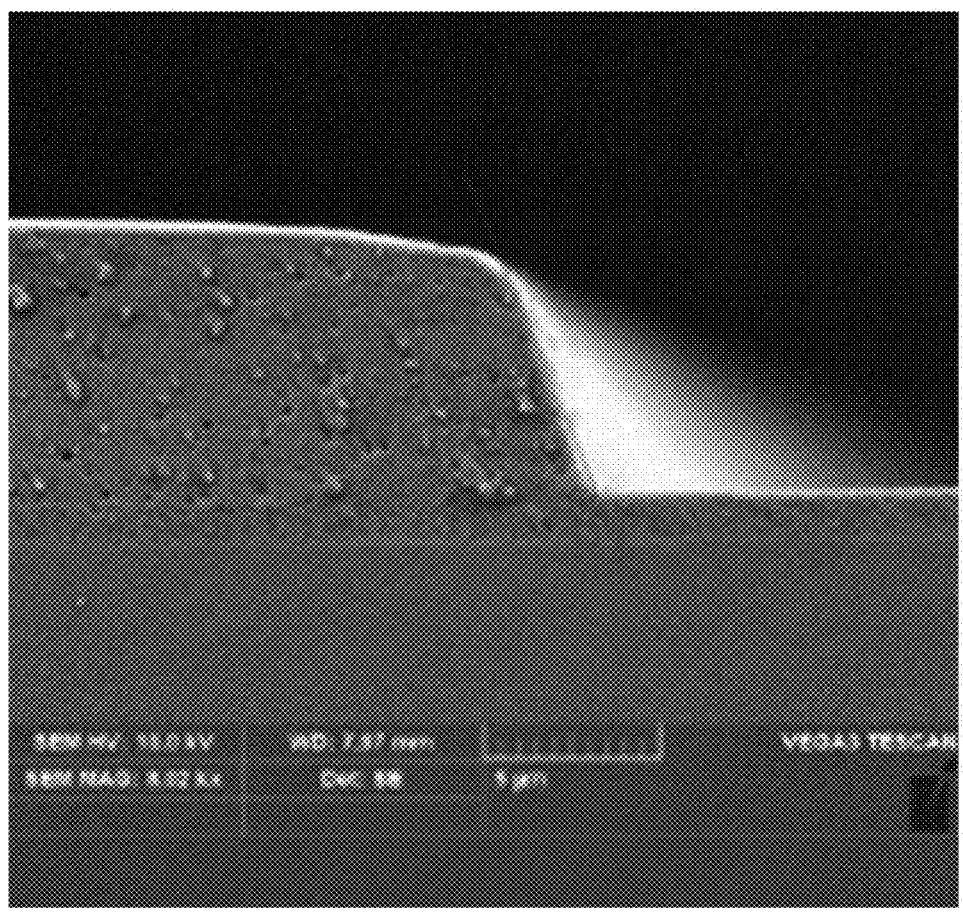
FIG. 12 is a SEM image showing a pattern of a photosensitive resin film after coating, exposing, and developing the composition of Example 4 on a substrate, prior to post-baking it.
Figure 13:
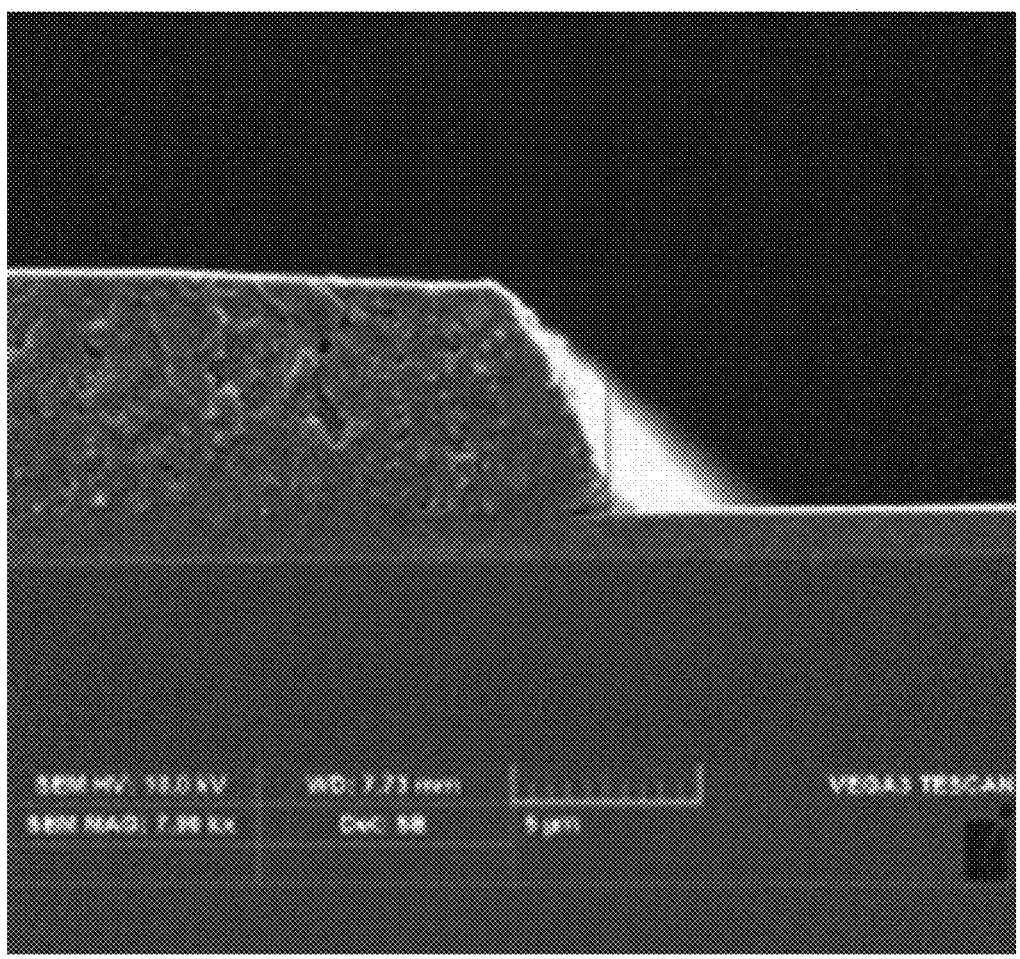
FIG. 13 is a SEM image showing a pattern of a photosensitive resin film after coating, exposing, developing, and post-baking the composition of Example 4 on a substrate.
Figure 14:
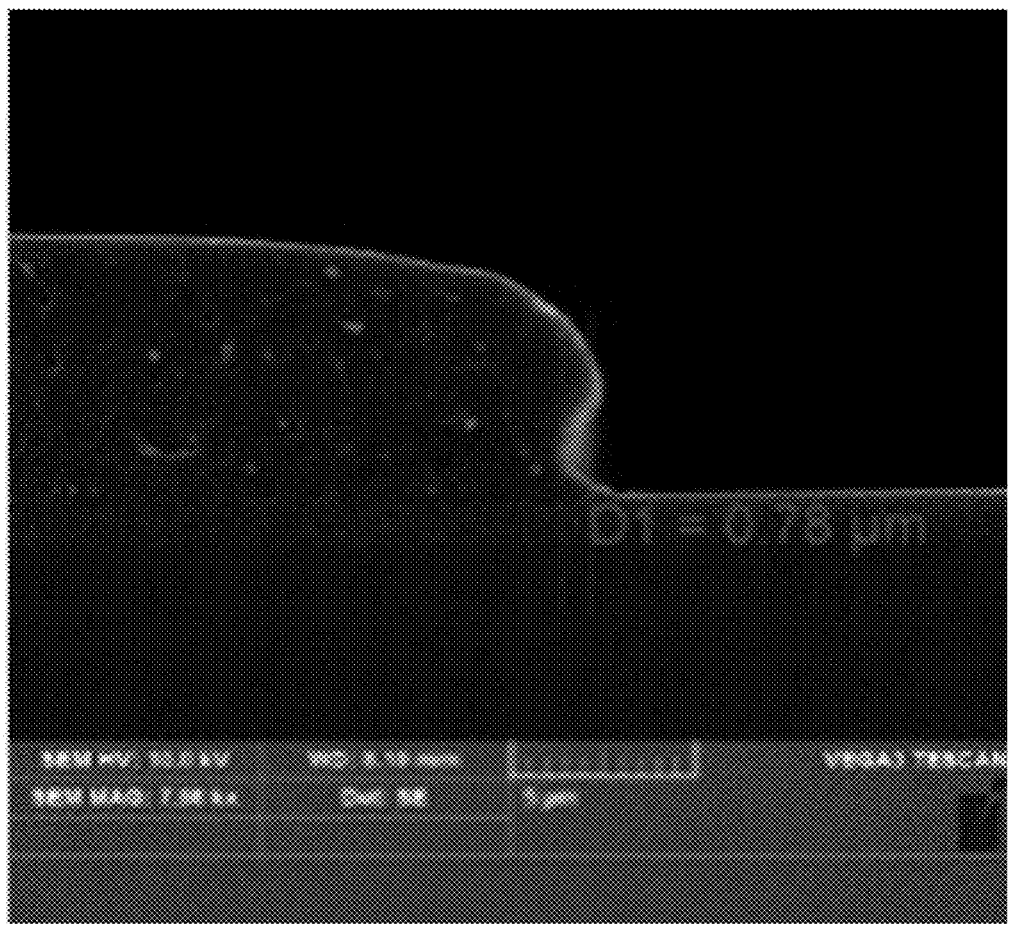
FIG. 14 is a SEM image showing a pattern of a photosensitive resin film after coating, exposing, and developing the composition of Comparative Example 2 on a substrate, prior to post-baking it.
Figure 15:
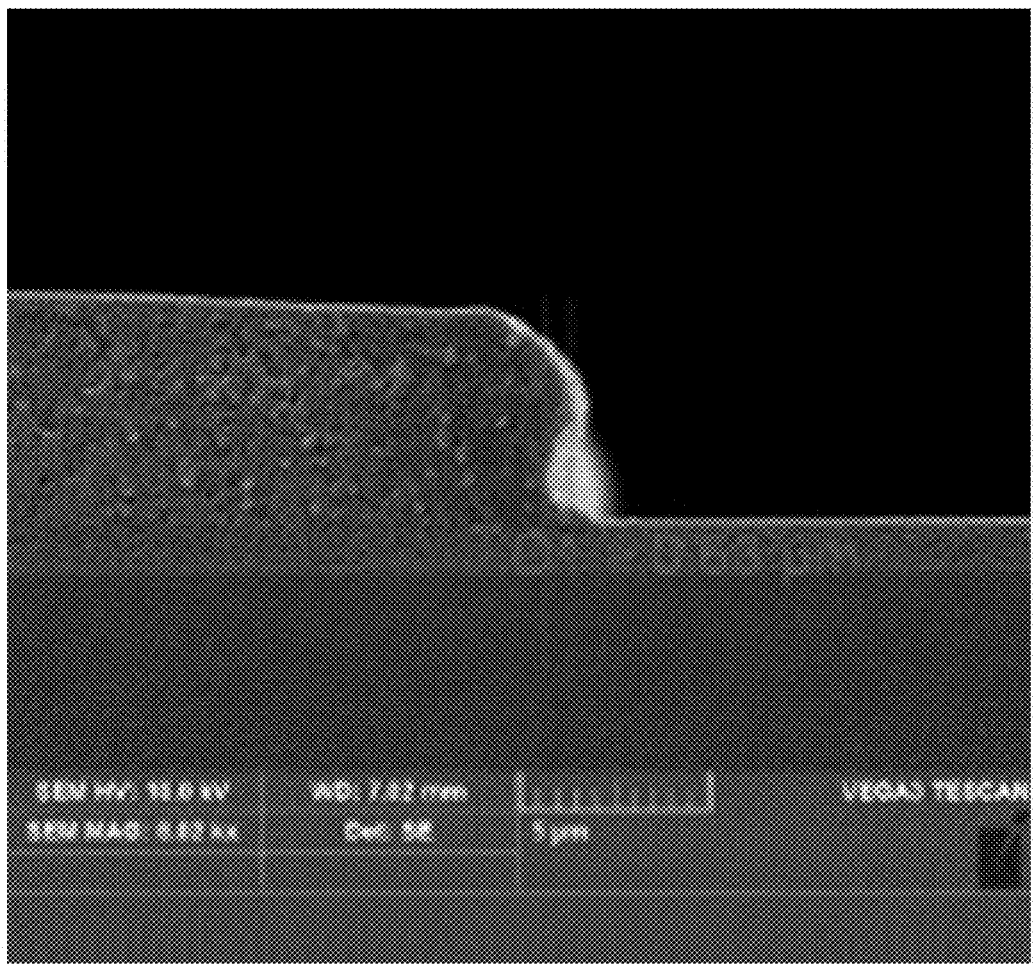
FIG. 15 is a SEM image showing a pattern of a photosensitive resin film after coating, exposing, developing, and post-baking the composition of Comparative Example 2 on a substrate.
Figure 16:
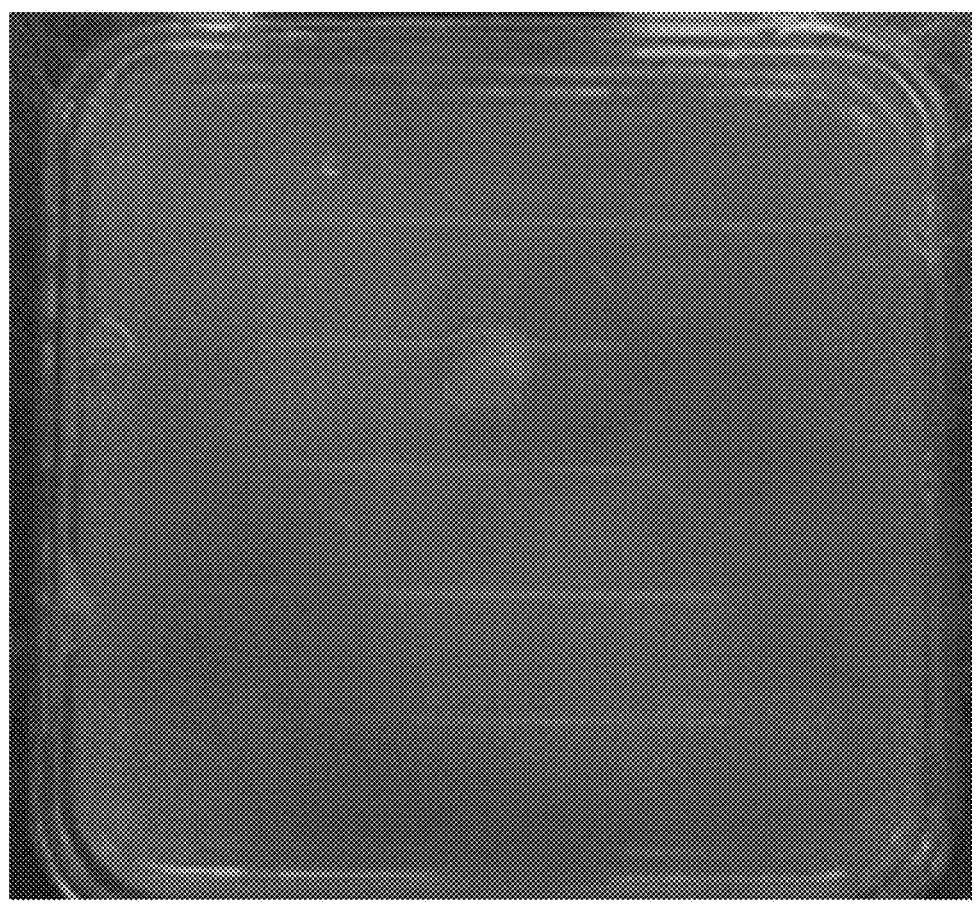
FIG. 16 is a photographic image showing a photosensitive resin film obtained by coating, exposing, and developing the composition of Example 1 on a substrate.
Figure 17:
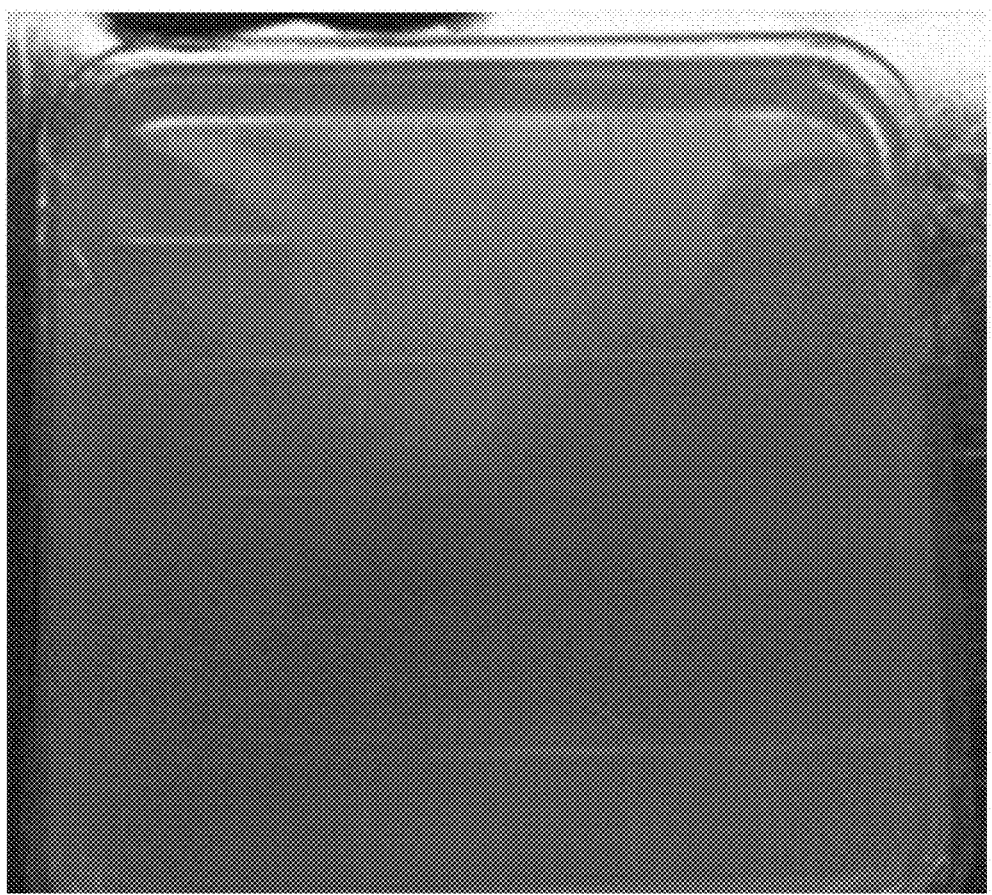
FIG. 17 is a photographic image showing a photosensitive resin film obtained by coating, exposing, and developing the composition of Example 2 on a substrate.
Figure 18:
FIG. 18 is a photographic image showing a photosensitive resin film obtained by coating, exposing, and developing the composition of Example 3 on a substrate.
Figure 19:
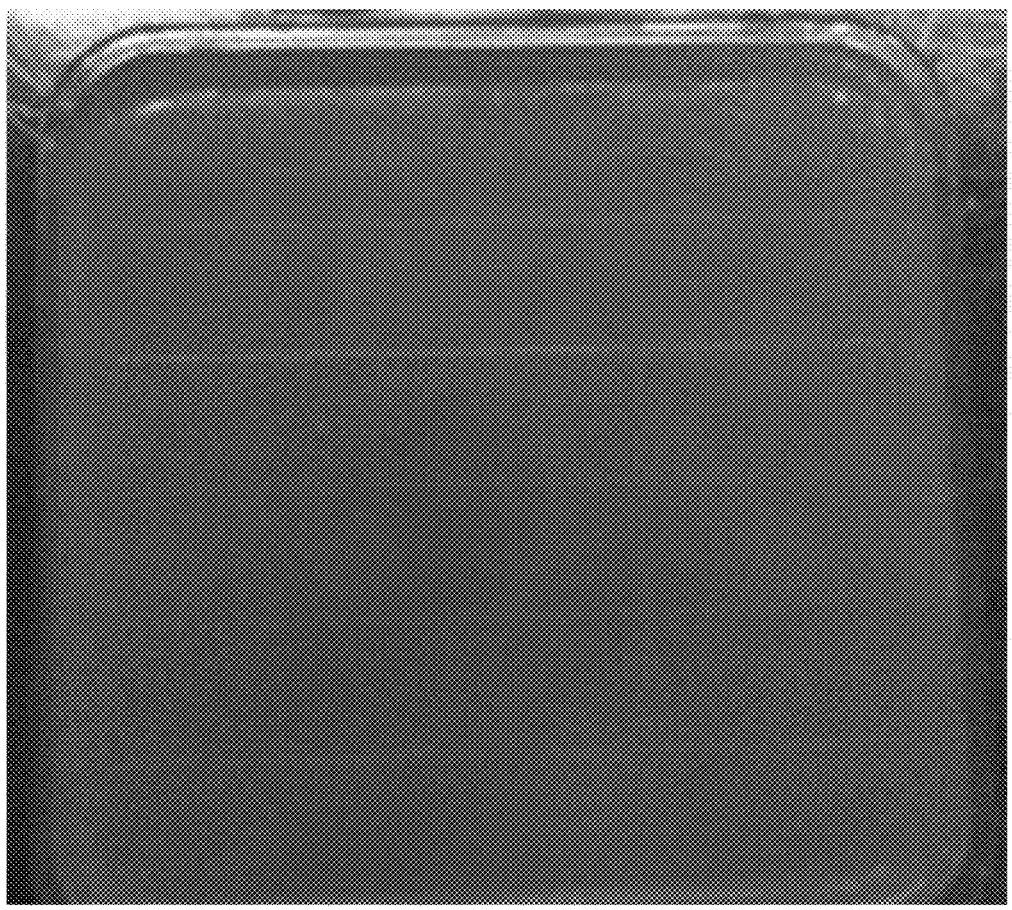
FIG. 19 is a photograph showing a photosensitive resin film obtained by coating, exposing, and developing the composition of Example 4 on a substrate.

Comparative Examples 1 and 2 was coated to a thickness of 6 μm on a 1 mm-thick degreased and washed glass substrate, and dried on a 90° C. hot plate for 2 minutes. Subsequently, the entire surface of each film was exposed to light (50 mJ/cm$^2$) from a high pressure mercury lamp having a main wavelength of 365 nm, and developed with a developer (SSP 200, SVS, Anseong, South Korea) to form a pattern. Herein, a 0.043% diluted KOH solution (Hyomyung Co. Ltd., Busan, South Korea) was used as the developing solution, and the time taken for the pattern to appear was measured in seconds. A developing time of about 25 seconds to about 35 seconds indicates that the film may be easily applied to an actual process. The completely developed pattern was photographed, and the results are shown in FIGS. 16 to 19. The completely developed pattern substrate was dried (post-baked) in a 230° C. forced convection drying furnace for 20 minutes to finish the pattern. The patterned sample was photographed through an optical microscope (BX-51, Hoya Corp., Tokyo, Japan), and the results are shown in FIGS. 1 to 5. In addition, the pattern before and after the post-baking was photographed using a scanning electron microscope (SEM) (VEGA2SBH, TESCAN, Brno, Czech Republic), and the results are shown in FIGS. 6 to 15.

As shown in FIGS. 1 to 19, when a binder resin including a vinyl group along with a thioaryl group is used in the film-forming composition, the taper characteristics of the pattern are enhanced. Without being bound by the correctness of any particular theory or explanation, it is thought that this is due to a lower hardness increase. Further, an undercut phenomenon of the film was improved (e.g., the prevalence and/or slope of an undercut profile was decreased). However, when a binder resin including no vinyl group was used, an undercut profile was generated. In addition, when a binder resin had too large a molecular weight (e.g., exceeding 12,000 g/mol), the film might be stripped from the substrate during KOH development and thus be difficult to actually apply.

As used herein, expressions such as "at least one of", "one of", and "selected from", when preceding a list of elements, modify the entire list of elements and do not modify the individual elements of the list. Further, the use of "may" when describing embodiments of the present disclosure refers to "one or more embodiments of the present disclosure".

In addition, as used herein, the terms "use", "using", and "used" may be considered synonymous with the terms "utilize", "utilizing", and "utilized", respectively.

As used herein, the terms "substantially", "about", and similar terms are used as terms of approximation and not as terms of degree, and are intended to account for the inherent deviations in measured or calculated values that would be recognized by those of ordinary skill in the art.

Also, any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein.

While this invention has been described in connection with what is presently considered to be practical example embodiments, it is to be understood that the invention is not limited to the disclosed embodiments, but, on the contrary, is intended to cover various modifications and equivalent arrangements included within the spirit and scope of the appended claims and equivalents thereof. Therefore, the aforementioned embodiments should be understood to be exemplary but not limiting the present invention in any way.

What is claimed is:

1. A photosensitive resin composition, comprising:

(A) a quantum dot;

(B) a binder resin including a structural unit represented by Chemical Formula 1-1, a structural unit represented by Chemical Formula 1-2, a structural unit represented by Chemical Formula 1-3, and structural units represented by Chemical Formula 2 at terminal ends of the binder resin;

(C) a photopolymerizable monomer;

(D) a photopolymerization initiator; and (E) a solvent, wherein the binder resin has a weight average molecular weight of about 2,000 g/mol to about 12,000 g/mol:

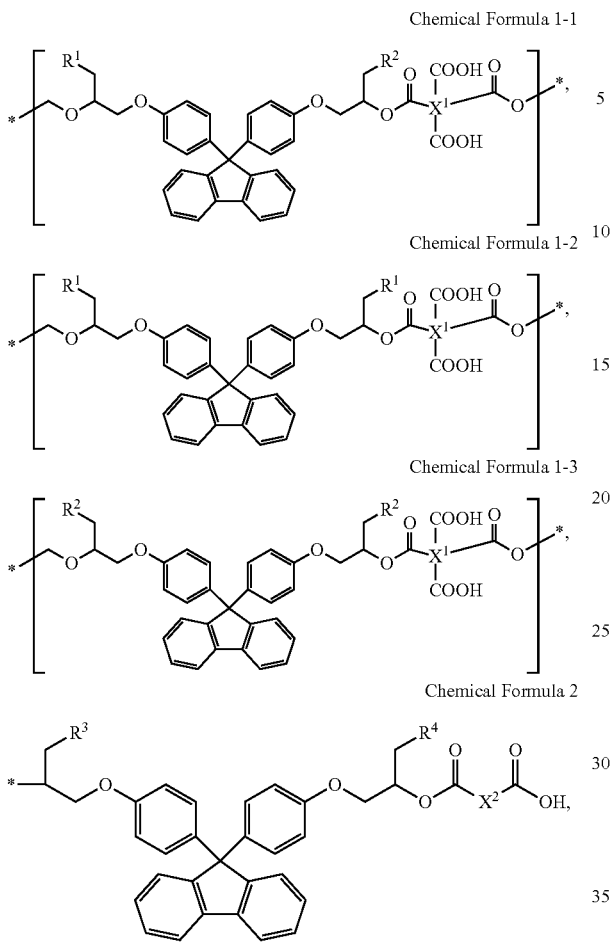

wherein, in Chemical Formula 1-1, Chemical Formula 1-2, Chemical Formula 1-3 and Chemical Formula 2,
$R^1$ is a substituted or unsubstituted acrylate group;
$R^2$ is a substituted or unsubstituted C6 to C20 thioaryl group;
$R^3$ and $R^4$ are each a substituted or unsubstituted C6 to C20 thioaryl group;
$X^1$ is a substituted or unsubstituted tetravalent organic group; and
$X^2$ is a substituted or unsubstituted divalent organic group.

2. The photosensitive resin composition of claim 1, wherein $X^1$ is represented by one of Chemical Formula X-1 to Chemical Formula X-3:

wherein, in Chemical Formula X-1,
$L^1$ is a single bond, an oxygen atom, a sulfur atom, *—C(=O)—* or *—$CR^{a1}R^{a2}$—*, and
wherein $R^{a1}$ and $R^{a2}$ are independently a halogen-substituted or unsubstituted C1 to C10 alkyl group.

3. The photosensitive resin composition of claim 1, wherein $X^2$ is represented by one of Chemical Formula X-4 to Chemical Formula X-10:

wherein, in Chemical Formula X-4, $R^b$ and $R^c$ are each independently a hydrogen atom, a substituted or unsubstituted C1 to C20 alkyl group, an ester group, or an ether group, and
wherein, in Chemical Formula X-8, $R^d$ is O, S, NH, a substituted or unsubstituted C1 to C20 alkylene group, a C1 to C20 alkylamine group, or a C2 to C20 alkenylamine group.

4. The photosensitive resin composition of claim 1, wherein the photosensitive resin composition further comprises a scatterer.

5. The photosensitive resin composition of claim 4, wherein the scatterer comprises barium sulfate, calcium carbonate, titanium dioxide, zirconia, or a combination thereof.

6. The photosensitive resin composition of claim 1, wherein the photosensitive resin composition further comprises a thiol-based additive.

7. The photosensitive resin composition of claim 6, wherein the thiol-based additive comprises at least two functional groups represented by Chemical Formula 3 at a terminal end of the thiol-based additive:

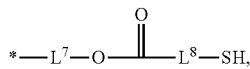

Chemical Formula 3 wherein, in Chemical Formula 3, $L^7$ and $L^8$ are each independently a single bond, a substituted or unsubstituted C1 to C20 alkylene group, a substituted or unsubstituted C3 to C20 cycloalkylene group, a substituted or unsubstituted C6 to C20 arylene group, or a substituted or unsubstituted C2 to C20 heteroarylene group.

8. The photosensitive resin composition of claim 1, wherein the quantum dot is to absorb light of about 360 nm to about 780 nm and is to emit fluorescence of about 500 nm to about 700 nm.

9. The photosensitive resin composition of claim 1, wherein the photosensitive resin composition further comprises a polymerization inhibitor.

10. The photosensitive resin composition of claim 9, wherein the polymerization inhibitor is included in an amount of about 0.01 wt % to about 2 wt % based on a total solid amount of the photosensitive resin composition.

11. The photosensitive resin composition of claim 9, wherein the polymerization inhibitor comprises a hydroquinone-based compound, a catechol-based compound, or a combination thereof.

12. The photosensitive resin composition of claim 1, wherein the photosensitive resin composition comprises:
    about 1 wt % to about 20 wt % of (A) the quantum dot;
    about 1 wt % to about 30 wt % of (B) the binder resin;
    about 1 wt % to about 15 wt % of (C) the photopolymerizable monomer;
    about 0.1 wt % to about 5 wt % of (D) the photopolymerization initiator; and
    a balance amount of (E) the solvent based on a total amount of the photosensitive resin composition.

13. The photosensitive resin composition of claim 1, wherein the photosensitive resin composition further comprises malonic acid; 3-amino-1,2-propanediol; a silane-based coupling agent; a leveling agent; a fluorine-based surfactant; or a combination thereof.

14. A photosensitive resin film manufactured using the photosensitive resin composition of claim 1.

15. A color filter comprising the photosensitive resin film of claim 14.

16. A display device comprising the color filter of claim 15.

* * * * *